(12) United States Patent
Sonoda et al.

(10) Patent No.: US 8,691,016 B2
(45) Date of Patent: Apr. 8, 2014

(54) DEPOSITION APPARATUS, AND DEPOSITION METHOD

(75) Inventors: Tohru Sonoda, Osaka (JP); Nobuhiro Hayashi, Osaka (JP); Shinichi Kawato, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 13/522,007

(22) PCT Filed: Oct. 29, 2010

(86) PCT No.: PCT/JP2010/006414
§ 371 (c)(1),
(2), (4) Date: Jul. 12, 2012

(87) PCT Pub. No.: WO2011/096030
PCT Pub. Date: Aug. 11, 2011

(65) Prior Publication Data
US 2012/0295379 A1 Nov. 22, 2012

(30) Foreign Application Priority Data
Feb. 3, 2010 (JP) ................................. 2010-022104

(51) Int. Cl.
*B05C 11/11* (2006.01)
*C23C 16/00* (2006.01)
*H01L 21/00* (2006.01)
*H01L 21/31* (2006.01)
*H01L 21/469* (2006.01)

(52) U.S. Cl.
USPC ........ 118/720; 118/504; 118/726; 427/248.1; 427/255.6; 438/758; 438/34; 438/30; 438/944

(58) Field of Classification Search
USPC ............ 438/34, 758, 778, 780; 118/504, 726, 118/301; 427/248.1, 255.6
See application file for complete search history.

(56) References Cited

U.S. PATENT DOCUMENTS 4,168,450 A * 9/1979 Yamauchi et al. ............ 313/403
4,469,719 A * 9/1984 Martin ........................ 427/255.5
(Continued)

FOREIGN PATENT DOCUMENTS

JP 10-102237 A 4/1998
JP 2000-48954 A 2/2000
(Continued)

OTHER PUBLICATIONS

International Search Report received for PCT Patent Application No. PCT/JP2010/006414, mailed on Nov. 22, 2010, 5 pages (2 page of English translation and 3 pages of PCT Search Report).

(Continued)

*Primary Examiner* — Mary Wilczewski
*Assistant Examiner* — Erik T Peterson
(74) *Attorney, Agent, or Firm* — Morrison & Foerster LLP

(57) ABSTRACT

A deposition mask 601 is used to form a thin film 3 in a prescribed pattern on a substrate 10 by deposition. Each of a plurality of improved openings 62A of the deposition mask 601 has a protruding opening portion 64, and is formed so that the opening amount at an end in a lateral direction is larger than that in a central portion in the lateral direction. In a deposition apparatus 50, the deposition mask 601 is held in a fixed relative positional relation with a deposition source 53 by a mask unit 55. In the case of forming the thin film 3 in a stripe pattern on the substrate 10 by the deposition apparatus 50, deposition particles are sequentially deposited on the substrate 10 while relatively moving the substrate 10 along a scanning direction with a gap H being provided between the substrate 10 and the deposition mask 601.

10 Claims, 14 Drawing Sheets

(56) References Cited

U.S. PATENT DOCUMENTS

| | | | |
|---|---|---|---|
| 6,255,775 B1* | 7/2001 | Ikuko et al. | 313/506 |
| 7,442,258 B2* | 10/2008 | Kim | 118/504 |
| 2001/0036691 A1* | 11/2001 | Kitazume et al. | 438/160 |
| 2003/0101932 A1* | 6/2003 | Kang | 118/504 |
| 2006/0279202 A1* | 12/2006 | Sakamoto et al. | 313/504 |
| 2007/0178708 A1 | 8/2007 | Ukigaya | |
| 2007/0231939 A1 | 10/2007 | Kuriya | |
| 2007/0266943 A1* | 11/2007 | Yeh et al. | 118/721 |
| 2009/0220691 A1* | 9/2009 | Kim | 427/248.1 |
| 2011/0045617 A1* | 2/2011 | Kang et al. | 438/22 |
| 2011/0053300 A1* | 3/2011 | Ryu et al. | 438/34 |
| 2011/0165327 A1* | 7/2011 | Park et al. | 427/248.1 |

FOREIGN PATENT DOCUMENTS

| | | | |
|---|---|---|---|
| JP | 2007-5123 A | | 1/2007 |
| JP | 2007-005123 A | * | 1/2007 |
| JP | 2007-191753 A | | 8/2007 |
| JP | 2007-227359 A | | 9/2007 |
| JP | 2007-265707 A | | 10/2007 |

OTHER PUBLICATIONS

Japanese Patent Application No. 2009-213570, filed on Sep. 15, 2009, titled "Jouchakusouchi oyobi Jouchakuhouhou", pp. 2-61, in 30 pages.

* cited by examiner (a)

(b)

DEPOSITION APPARATUS, AND DEPOSITION METHOD

CROSS REFERENCE TO RELATED APPLICATIONS

This is a U.S. National Phase patent application of PCT/JP2010/006414, filed Oct. 29, 2010, which claims priority to Japanese Patent Application No. 2010-022104, filed Feb. 3, 2010, each of which is hereby incorporated by reference in the present disclosure in its entirety.

TECHNICAL FIELD

The present invention relates to deposition masks that are preferably used in, e.g., large-sized organic EL (Electro Luminescence) displays etc.

BACKGROUND ART

In recent years, a larger size, higher image quality, and lower power consumption have been required for flat panel displays, and high image quality organic EL displays capable of being driven at a low voltage have received considerable attention. The organic EL displays have the following structure. For example, in full color active matrix organic EL devices, thin film-like organic EL elements are provided on a substrate having thin film transistors (TFTs) thereon. In the organic EL element, organic EL layers including red (R), green (G), and blue (B) light-emitting layers are stacked between a pair of electrodes, and each light-emitting layer emits light in response to a voltage applied between the electrodes. This light is used to display an image.

In manufacture of such organic EL displays, thin films such as light-emitting layers and electrodes are patterned by using a technique such as a vacuum deposition method, an ink jet method, or a laser transfer method. For example, in low molecular organic EL displays (organic light-emitting diodes (OLED)), the vacuum deposition method is mainly used to pattern the light-emitting layers.

In the vacuum deposition method, a mask having a predetermined opening patterned therethrough is fixed to a substrate in close contact therewith, and is placed in a vacuum chamber so that the mask side of the substrate faces a deposition source. Then, a film-forming material is deposited from the deposition source to a desired position on the substrate through the opening of the mask. A thin film such as the light-emitting layers is patterned in this manner. The light-emitting layer of each color is separately deposited color by color (separate deposition). In particular, a mass production process uses a mask (a full contact shadow mask) having the same size as the substrate, and the substrate having the mask in close contact therewith is typically fixed at a predetermined position with respect to the deposition source when performing deposition.

A vacuum deposition method is also known, in which deposition is performed while relatively moving a substrate etc. with respect to a deposition source (Patent Document 1). In Patent Document 1, a mask is used in which a plurality of small holes or long slit holes having a smaller area than an electrode to be formed are formed at predetermined intervals. Deposition is performed while moving the mask in a direction crossing the direction in which the small holes etc. are arranged, whereby the electrode having a predetermined pattern is formed.

Regarding the present invention, a method is disclosed in which unevenness of the surface of a thin film, which is produced by a deposition process, is reduced by using predetermined conditions such as the emission angle of a thin film material that is emitted from a deposition source, positioning of a substrate and a deposition mask, etc. (Patent Document 2).

In Patent Document 2, a mask having mesh patterns with different aperture ratios for the pixels of each color (RGB) is used in order to form a hole transport layer having different thicknesses for the pixels of each color by a deposition method. This mask is placed to face the substrate with a spacer interposed therebetween, and is mounted in a predetermined deposition apparatus. When emitted from the deposition source toward the substrate, the thin film material (the material of the hole transport layer) is deposited on the substrate according to the aperture ratios, thereby forming a hole transport layer having different thicknesses. The hole transport layer thus formed is heated and melted, and then solidified in order to make its surface flat.

A method of using predetermined conditions such as the emission angle of the thin film material emitted from the deposition source, etc. is disclosed as a method of eliminating this heat treatment. Specifically, the deposition conditions are determined so as to satisfy the relation of $\tan(90-\theta/2)=H/W$, where "$\theta$" represents the emission angle of the thin film material from the deposition source, "H" represents the interval between the substrate and the mask, and "W" represents the mesh width of the mask. This allows the thin film material emitted from the deposition source to be deposited on the substrate below the mesh patterns, whereby the unevenness of the thin film surface is reduced.

CITATION LIST

Patent Document

PATENT DOCUMENT 1: Japanese Patent Publication No. H10-102237
PATENT DOCUMENT 2: Japanese Patent Publication No. 2007-5123

SUMMARY OF THE INVENTION

Technical Problem

In the case of patterning light-emitting layers etc. by a vacuum deposition method in a conventional mass production process, the mask size increases as the substrate size increases. Accordingly, a gap tends to be produced between the substrate and the mask due to bending or extension of the mask due to its own weight. This makes it difficult to perform accurate patterning, and thus to implement higher definition due to displacement of the deposition position or color mixture.

As the substrate size increases, the size of the mask, a frame holding the mask, etc. becomes enormous, and the weight thereof increases accordingly. Accordingly, it is difficult to handle them, which may adversely affect productivity and safety. Associated apparatuses are similarly increased in size and become complicated, whereby it is difficult to design the devices, and installation cost become very high.

Accordingly, it is difficult to apply the conventional vacuum deposition method to the large substrates, and a method that allows patterning to be performed on large substrates of more than 60 inches by mass production has not been implemented.

The inventor has proposed a deposition method that can be applied to such large substrates (herein referred to as the "new deposition method") (Japanese Patent Application No. 2009-213570).

Specifically, a mask unit is used which is formed by integrating a deposition source and a shadow mask having a smaller area than a substrate. With the shadow mask and the substrate being held with a constant gap therebetween, deposition is performed while relatively scanning the mask unit with respect to the substrate. This avoids the above problems associated with the increased substrate size, and allows patterning to be performed on a large substrate by deposition in a mass production process.

In the new deposition method, however, a patterned thin film has a non-uniform thickness in some cases.

FIG. 1 is a schematic view showing a deposition process in the new deposition method. In the figure, the reference character "101" represents a substrate, "102" represents a deposition mask, "102a" represents an opening, "103" represents a deposition source, and "103a" represents an emission port through which deposition particles are emitted, and "110" represents a thin film such as a light-emitting layer formed on the substrate. The deposition mask 102 and the deposition source 103 are used as a unit, and are held in a fixed relative positional relation therebetween. An arrow represents a relative scanning direction of the deposition mask 102 etc. with respect to the substrate 101.

In the new deposition method, deposition is performed with a constant gap between the deposition mask 102 and the substrate 101. Accordingly, as shown in FIG. 2, a phenomenon was observed in which the thin film 110 was thinner at both ends 110b, 110b than in a central portion 110a in a direction (a lateral direction of the thin film 110) perpendicular to the scanning direction. This phenomenon seemed to occur mainly for the following two reasons.

(Influence of Deposition Angle)

As shown in FIG. 3, the angle (the deposition angle) at which the deposition particles can be deposited varies between a central portion and both ends of a deposition region 101a of the substrate 101, which faces the opening 102a of the deposition mask 102. That is, since the deposition mask 102 is accurately positioned parallel to the substrate 101, the deposition angle θ1 at which the deposition particles can be directed to the central portion through the opening 102a is always larger than the deposition angle θ2 at which the deposition particles can be directed to each end through the opening 102a. In other words, the width of the opening 102a though which the deposition particles can pass is substantially narrower at the ends than in the central portion. As a result, the deposition particles are less likely to be deposited on both ends of the deposition region 101a than on the central portion thereof, whereby the thin film 110 has a difference in thickness.

(Influence of Deposition Distribution)

The thickness of the thin film 110 can be influenced by distribution of the deposition particles. For example, measured deposition distribution is usually as shown in FIG. 4B on a plane perpendicular to an emission direction (shown by a deposition centerline L1) of the deposition source 103 as shown in FIG. 4A. In FIG. 4B, the abscissa represents a spread angle θ3 from the deposition centerline L1, and the ordinate represents a deposition amount.

The deposition amount is the largest at a position (the spread angle θ3=0°) immediately above the emission port 103a, and decreases as the distance from this position increases (as the spread angle θ3 increases). Accordingly, if, e.g., the deposition region 101a is placed so that the central portion thereof is located immediately above the emission port 103a, the deposition particles in the distribution center (shown by "S1") are deposited on the central portion of the deposition region 101a, and the deposition particles on the right or left side of the distribution center (shown by "S2") in the figure are deposited on each end of the deposition range 101a. As a result, the deposition amount is smaller at both ends of the deposition region 101a than in the central portion thereof, whereby the thin film 110 has a difference in thickness.

The thin film having a difference in thickness has the following problems. For example, if the thickness of an organic film in a pixel is a predetermined value or more (e.g., 2% or more of an average thickness), not only the difference in luminance is visually recognized, but also the luminance decreases in the thin part of the film due to an increased amount of current caused by a strong electric field. Moreover, concentration of the electric field on the thin part of the organic film may cause a short-circuit between electrodes, which may result in a defective pixel. Accordingly, it is preferable to make the film thickness as uniform as possible in order to improve image display performance, long-term product reliability, etc.

The difference in thickness of the thin film can be eliminated by, e.g., using the method of Patent Document 2. However, this method can decrease the amount of reduction in film thickness in a portion (corresponding to the central portion of the pixel region) between two adjoining openings, but cannot decrease the amount of reduction in film thickness at the ends.

Moreover, as described above, the deposition amount is substantially smaller at the ends of the deposition region than in the central portion thereof. Accordingly, the difference in film thickness is not completely eliminated by merely using such conditions that the deposition amounts of the two ends overlap each other. In particular, the difference in film thickness in the central portion of the deposition region is more disadvantageous than the difference in thickness at the ends of the deposition region, because the difference in film thickness in the central portion of the deposition region greatly affects image quality etc.

Moreover, the difference in thickness decreases as the size of the thin film decreases. Accordingly, precise setting is required to substantially eliminate the difference in thickness, but the conditions used in the above method are not sufficient.

It is an object of the present invention to provide a deposition mask etc. capable of further improving image display performance, long-term product reliability, etc. by increasing uniformity of the film thickness.

Solution to the Problem

In order to achieve the above object, the present invention was developed in terms of the shape and positioning of a deposition mask.

For example, a deposition mask of the present invention is used to form a thin film in a prescribed pattern on a substrate by deposition. The deposition mask includes: a plate-like mask body; and a plurality of openings arranged in line in the mask body. The plurality of openings include an improved opening in which an opening amount in a longitudinal direction perpendicular to a lateral direction varies depending on a position in the lateral direction, and the lateral direction is a direction parallel to a direction in which the plurality of openings are arranged. The improved opening is formed so that the opening amount at an end in the lateral direction is larger than that in a central portion in the lateral direction.

According to this deposition mask, the improved opening is formed so that the opening amount at the end in the lateral direction is larger than that in the central portion in the lateral direction. Accordingly, deposition time at the end can be increased by mounting the deposition mask on a deposition apparatus so that the longitudinal direction is parallel to a scanning direction.

The increased deposition time can compensate for reduction in thickness at both ends of the thin film, whereby uniformity of the thickness of the thin film can be improved. As a result, a reliable organic EL display having high display quality can be implemented.

Specifically, the improved opening may have a protruding opening portion in at least one end portion in the longitudinal direction, and the protruding opening portion may open in the end in the lateral direction so as to protrude with respect to the central portion in the lateral direction.

More specifically, the protruding opening portion is preferably formed so that its opening amount gradually increases as a distance from the central portion in the lateral direction toward the end in the lateral direction increases.

Thus, the thickness of the thin film can be made uniform in a balanced manner from the central portion to the end in the lateral direction.

The protruding opening portion may be divided into a plurality of partial opening portions.

This can increase the strength of the deposition mask, and facilitates formation thereof.

For a deposition process, a deposition apparatus may be used which includes: such a deposition mask; a deposition source that emits deposition particles forming the thin film; a mask unit that includes the deposition mask and the deposition source, and maintains a fixed relative positional relation between the deposition mask and the deposition source; a substrate support apparatus that supports the substrate; and a moving apparatus that relatively moves at least one of the mask unit and the substrate along a predetermined scanning direction with a constant gap being provided between the substrate and the deposition mask, wherein the deposition mask is placed so that the longitudinal direction is parallel to the scanning direction.

This allows deposition to be performed even in, e.g., large-sized organic EL displays. Accordingly, mass production of the large-sized organic EL displays having excellent image display performance, high long-term product reliability, etc. can be implemented.

As a specific example of a deposition method, a deposition method for forming the thin film in a stripe pattern on the substrate by using this deposition apparatus includes: an aligning step of, with the substrate being supported by the substrate support apparatus and with the gap being provided between the substrate and the deposition mask, aligning the mask unit and the substrate so that the mask unit faces the substrate; and a deposition step of forming the thin film by sequentially depositing the deposition particles while relatively moving at least one of the mask unit and the substrate along the predetermined scanning direction by the moving apparatus.

This deposition method allows the large-sized organic EL displays having excellent image display performance, high long-term product reliability, etc. to be manufactured by merely performing a predetermined operation. Accordingly, this deposition method is preferable for a mass production process.

In particular, in the case where a substrate for an organic EL display in which a plurality of pixels each having a light-emitting region configured to emit light are arranged in a grid pattern is used as the substrate, the plurality of openings are preferably placed so as to face a plurality of film formation pixels that are included in the plurality of pixels, and the deposition mask is positioned so that each of the light-emitting regions of the film formation pixels is located inside the improved opening in the lateral direction with a gap therebetween, as viewed from a direction perpendicular to the substrate.

Since each of the light-emitting regions of the film formation pixels is located inside the improved opening with the gap therebetween, defective formation of the thin film due to a difference in dimensions between the deposition mask and the substrate and misalignment therebetween can be reduced, whereby productivity in a mass production process can be improved.

It is preferable that a first relational expression (Lw/L≥T/Tw) be satisfied, where a centerline passes through a center in the lateral direction of the improved opening and extends in the longitudinal direction, "Lw" represents the opening amount of the improved opening including the protruding opening portion, at a predetermined distance W from the centerline toward the end in the lateral direction, and if the improved opening has no protruding opening portion, "Tw" represents a thickness of the thin film at the predetermined distance, "L" represents the opening amount in the central portion in the lateral direction, and "T" represents a thickness in the central portion in the lateral direction of the thin film (a unit of "T," "L," "Tw," and "Lw" is millimeter).

This can easily increase the uniformity of the thin film, whereby the large-sized organic EL displays having excellent image display performance, high long-term product reliability, etc. can be easily implemented.

A deposition apparatus may be configured as follows.

That is, a deposition apparatus that is used to form a thin film in a prescribed pattern on a substrate by deposition includes: a deposition mask having a plurality of openings arranged in line; a deposition source that emits deposition particles forming the thin film toward the substrate; a mask unit that includes the deposition mask and the deposition source, and maintains a fixed relative positional relation between the deposition mask and the deposition source; a substrate support apparatus that supports the substrate; and a moving apparatus that relatively moves at least one of the mask unit and the substrate along a predetermined scanning direction with a constant gap H being provided between the substrate and the deposition mask.

The deposition mask is placed so that a lateral direction in which the plurality of openings are arranged is perpendicular to the scanning direction. The plurality of openings include a second improved opening that is formed by a plurality of element openings separated from each other in the lateral direction. The plurality of element openings in the second improved opening adjoin each other with a constant gap S therebetween in the lateral direction.

A second relational expression (S<H×tan θ, θ=α when α≤β, and θ=β when α>β) is satisfied, where "α" represents a spread angle at which the deposition particles spread with respect to an emission direction substantially perpendicular to the substrate, and "β" represents a largest angle at which the deposition particles can pass through the element opening (a unit of "S" and "H" is micrometer, and a unit of "α" and "β" is degree), as viewed from the scanning direction.

This configuration can increase uniformity of the film thickness in the central portion even if, e.g., the width of the thin film is increased. Moreover, as described below in detail, since the width of undesirable deposition is reduced, the influence of the end in the lateral direction of the thin film can be reduced, whereby the uniformity of the film thickness can be increased accordingly.

A deposition method similar to that used in the above deposition apparatus can be used in this deposition apparatus.

In particular, in the case where a substrate for an organic EL display in which a plurality of pixels each having a light-emitting region configured to emit light are arranged in a grid pattern is used as the substrate, the deposition mask is preferably positioned in a manner similar to that of the above deposition apparatus.

Advantages of the Invention

As described above, the deposition mask etc. of the present invention can increase uniformity of the film thickness, and can further improve image display performance, long-term product reliability, etc.

BRIEF DESCRIPTION OF THE DRAWINGS

FIG. 4A is a schematic diagram showing a deposition state, and FIG. 4B is a schematic diagram showing deposition distribution.

FIG. 15A is a schematic plan view of an improved opening, and FIG. 15B is a schematic cross-sectional view of an element film.

FIG. 20A shows a deposition source as viewed from a scanning direction, and FIG. 20B shows the deposition mask and a substrate as viewed from the scanning direction.

DESCRIPTION OF EMBODIMENTS

Embodiments of the present invention will be described in detail below based on the accompanying drawings. The following description is essentially by way of example only, and is not intended to limit the present invention, its applications, or its uses.

[First Embodiment]
(Organic EL Display)

The present embodiment is described with respect to an example in which the present invention is applied to manufacture of organic EL displays. An organic EL display of the present embodiment is an active matrix display that implements full color image display by controlling light emission of a plurality of pixels (sub-pixels) of red, green, and blue (also collectively referred to as "RGB").

Figure 1:
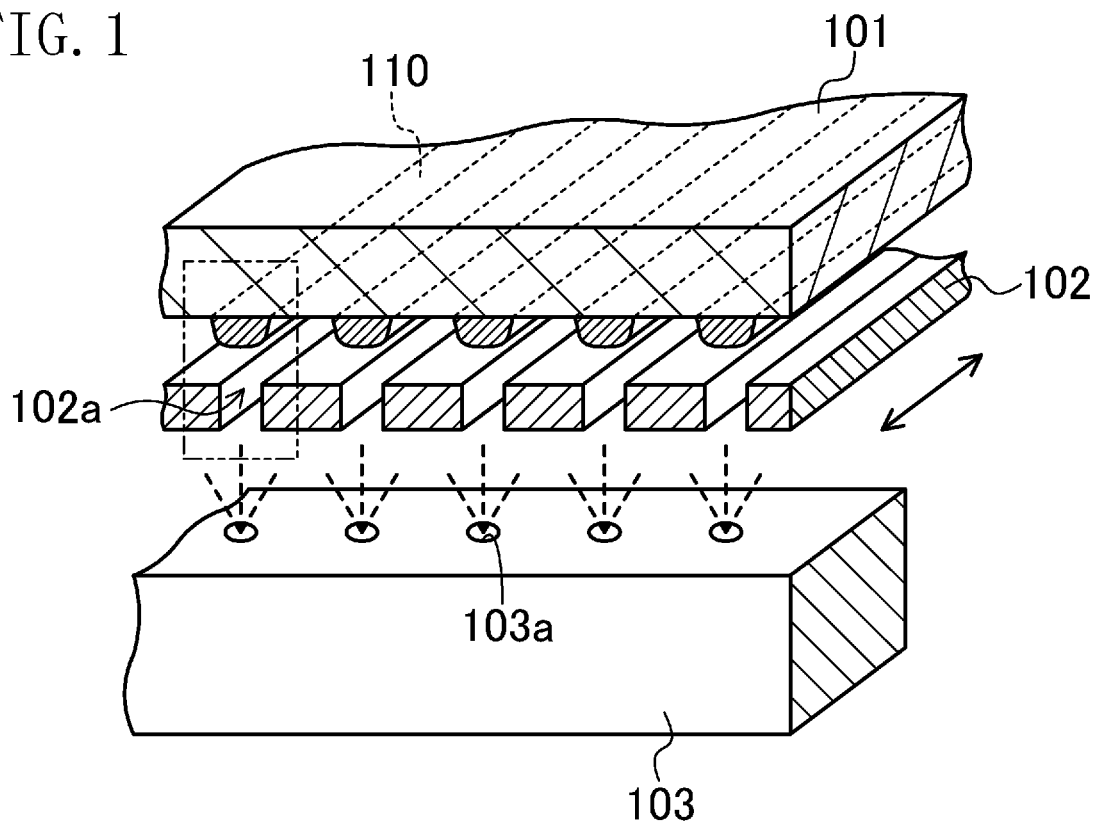
FIG. 1 is a schematic diagram showing an example of a deposition process in a new deposition method.
Figure 2:
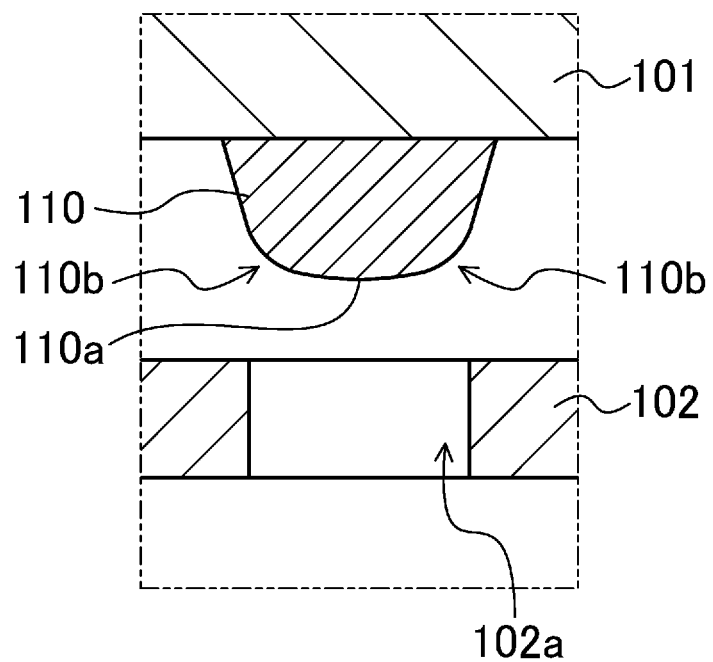
FIG. 2 is an enlarged schematic diagram of a portion shown by a two-dot chain line in FIG. 1.
Figure 3:
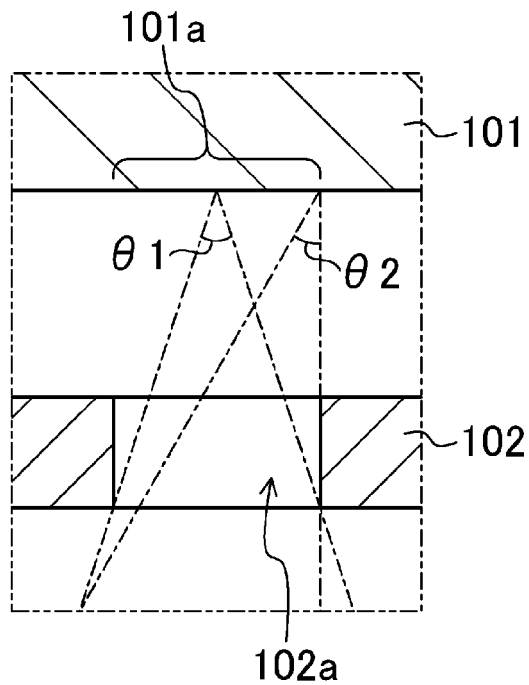
FIG. 3 is a diagram illustrating the influence of a deposition angle.
Figure 4:
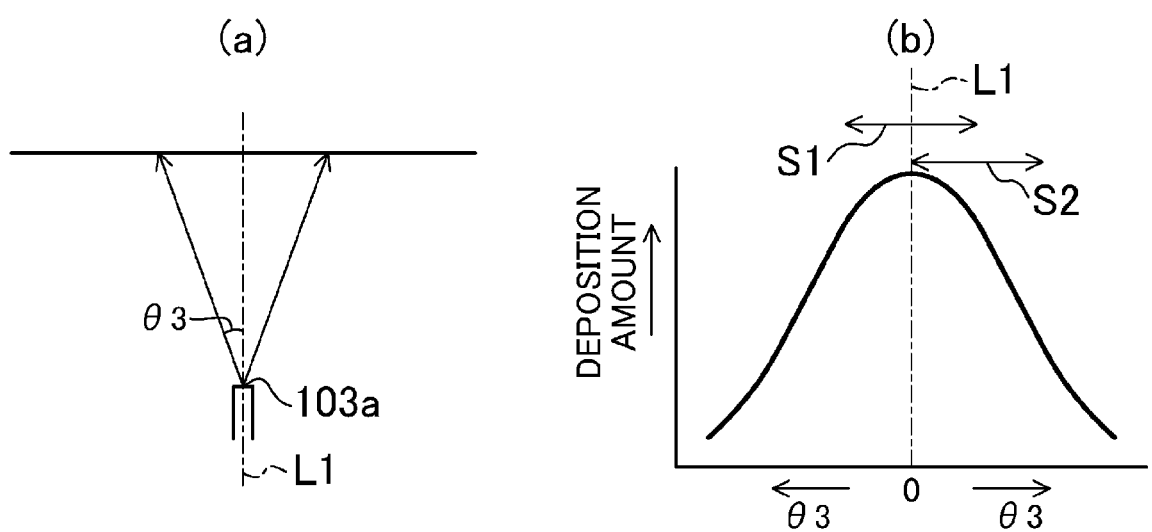
FIGS. 4A-4B are diagrams illustrating the influence of deposition distribution, where
Figure 5:
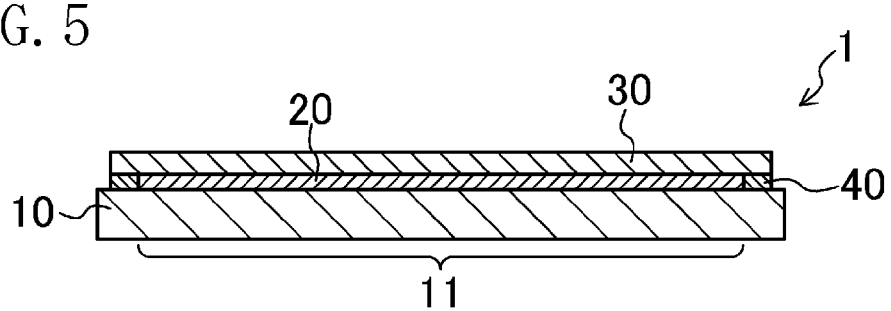
FIG. 5 is a schematic cross-sectional view showing an organic EL display in a first embodiment.

As shown in FIG. 5, an organic EL display 1 of the present embodiment is formed by a substrate 10, a thin film-like organic EL element 20, a sealing plate 30, etc. The substrate 10 and the sealing plate 30 have a shape of a rectangular plate, and the organic EL element 20 is inserted therebetween and is enclosed and hermetically sealed by a sealing member 40 such as an adhesive. A central portion of the surface of the substrate 10 serves as a display region 11 that provides image display, and the organic EL element 20 is placed in the display region 11.

Figure 6:
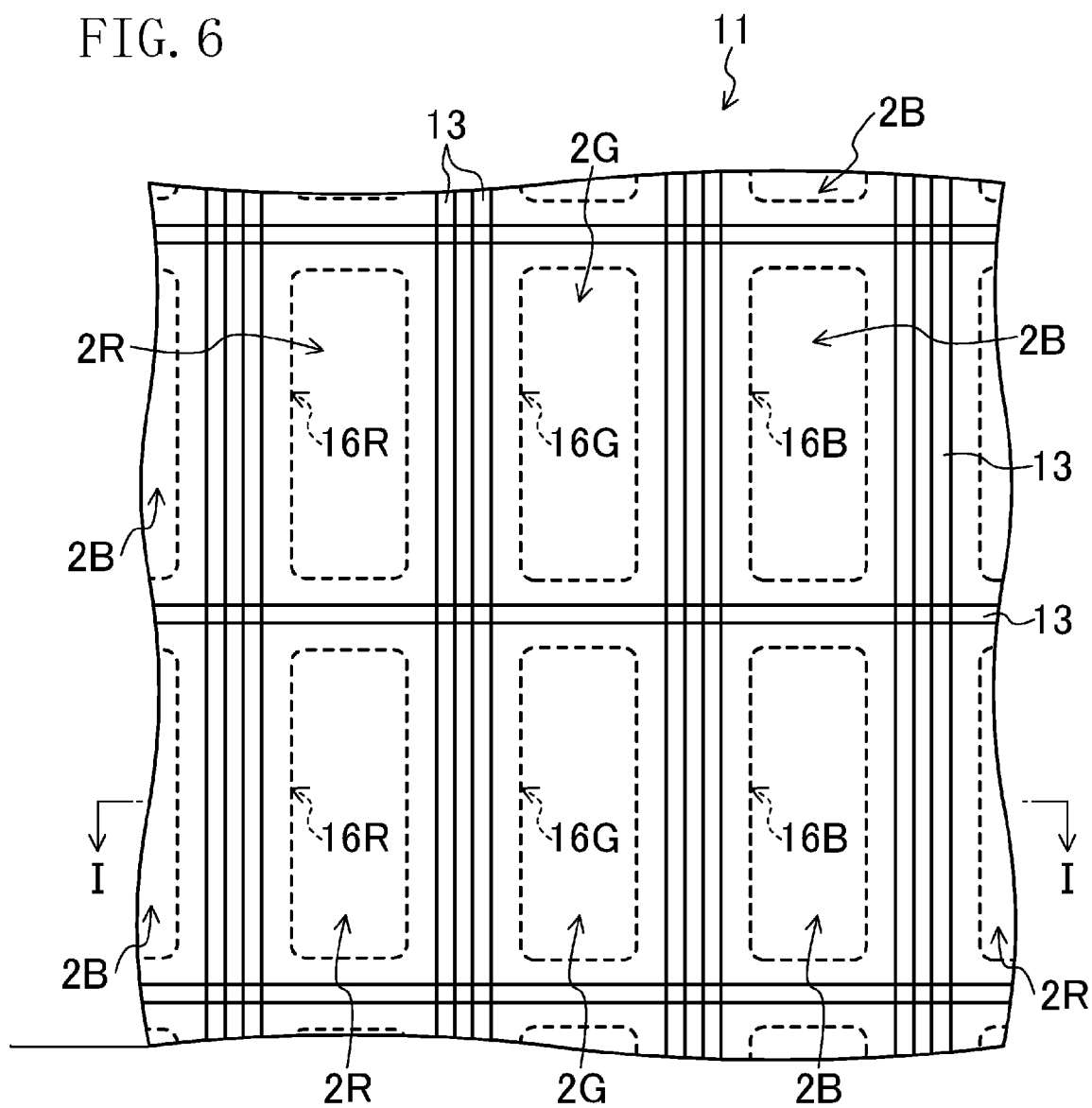
FIG. 6 is a schematic plan view showing a main part of a substrate.
Figure 7:
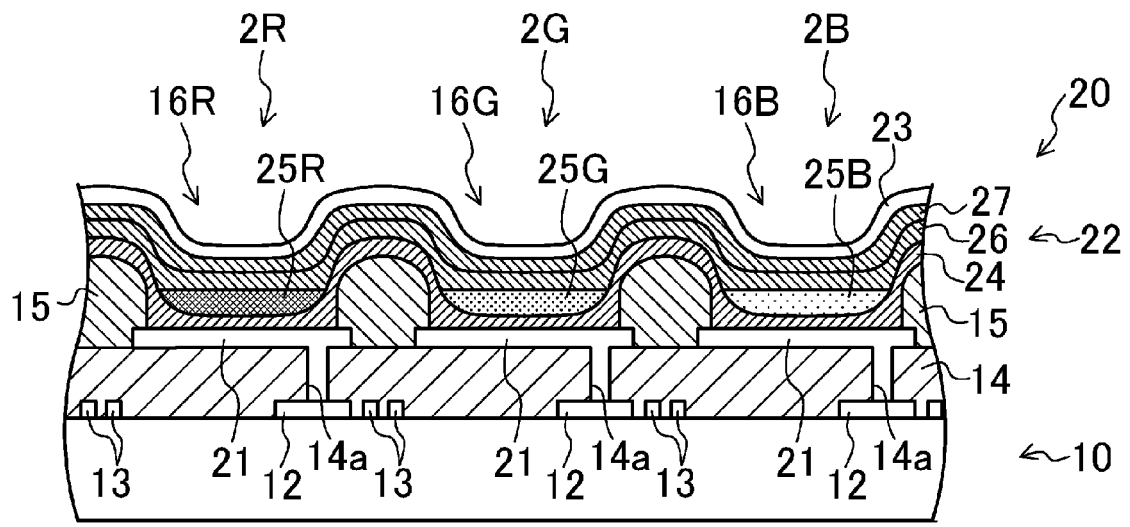
FIG. 7 is a schematic diagram showing a cross section taken along line I-I in FIG. 6.

As shown in FIGS. 6 and 7, thin film transistors (TFTs) 12, interconnects 13, an interlayer film 14, etc. are provided in the display region 11 of the substrate 10.

A glass plate etc. is used as the substrate 10. The substrate 10 is preferably transparent because the organic EL display 1 of the present embodiment is of a bottom emission type in which emitted light is output from the side of the substrate 10. However, the substrate 10 need not necessarily be transparent if the organic EL display 1 is of a top emission type. The interconnects 13 are patterned on the substrate 10, and are comprised of a plurality of gate lines extending parallel to each other, a plurality of signal lines crossing the gate lines and extending parallel to each other. RGB sub-pixels 2R, 2G, 2B are arranged in a plurality of regions each surrounded by the interconnects 13 such as the gate lines and forming a grid pattern. The TFTs 12 that control light emission are respectively provided in the sub-pixels 2R, 2G, 2B.

The RGB sub-pixels 2R, 2G, 2B are arranged so that the sub-pixels of the same color are arranged in line in a row direction and are arranged in a repeated pattern of RGB in a column direction. Every three sub-pixels 2R, 2G, 2B of RGB that are successively arranged in the column direction form one pixel. As described in detail below, light-emitting layers 25R, 25G, 25B of the sub-pixels 2R, 2G, 2B are respectively formed by thin films 3 that are formed for each color so as to have a stripe pattern.

The interlayer film 14 is an insulating thin film of an acrylic resin etc., which functions also as a planarizing film. The interlayer film 14 is stacked over the entire display region 11 so as to cover the TFTs 12 etc. If the organic EL display 1 is of a bottom emission type, the interlayer film 14 is preferably transparent.

The organic EL element 20 is formed by first electrodes 21 (anodes), an organic EL layer 22, a second electrode 23 (a cathode), etc. The first electrodes 21 are comprised of indium tin oxide (ITO) etc. An ITO film etc. is stacked on the interlayer film 14, and is patterned into the plurality of first electrodes 21 in a grid pattern corresponding to the sub-pixels 2. The first electrodes 21 are respectively connected to the TFTs 12 via contact holes 14*a*. An insulating edge cover 15 is stacked on the first electrodes 21. The edge cover 15 has light-emitting regions 16R, 16G, 16B formed as rectangular openings so as to correspond to the sub-pixels 2, respectively. A large part of the first electrode 21 is exposed from the light-emitting region 16R, 16G, 16B, and the ends of the first electrode 21 are covered by the edge cover 15. Light emission of each pixel is output through these light-emitting regions 16R, 16G, 16B.

The organic EL layer 22 is provided between the first electrodes 21 and the second electrode 23. In the organic EL layer 22 of the present embodiment, a hole transport layer 24, light-emitting layers 25R, 25G, 25B, an electron transport layer 26, and an electron injection layer 27 are sequentially stacked from the side of the first electrodes 21. The hole transport layer 24 of the present embodiment also functions as a hole injection layer. The configuration of the organic EL layer 22 shown in the present embodiment is merely an example and is not limited to this, and the organic EL layer 22 may be formed by combining the layers as necessary. For example, a hole injection layer may be provided separately from the hole transport layer 24, and a blocking layer may further be provided. The organic EL layer 22 need only include at least the light-emitting layers 25R, 25G, 25B. Known materials can be used as the materials of the hole transport layer 24, the light-emitting layers 25R, 25G, 25B, etc.

The hole transport layer 24, the electron transport layer 26, and the electron injection layer 27 are stacked over the entire display region 11. As described above, the light-emitting layers 25R, 25G, 25B have a stripe pattern corresponding to the sub-pixels 2 of each color. The second electrode 23 is stacked over the entire display region 11 so as to cover the organic EL layer 22.

(Basic Manufacturing Method of Organic EL Display 1)

Figure 8:
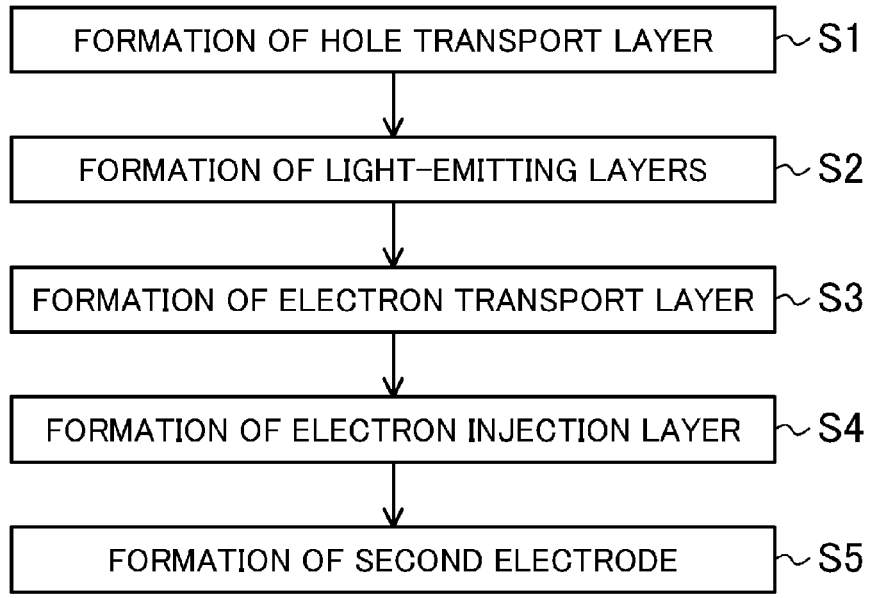
FIG. 8 is a flowchart showing a basic manufacturing process of the organic EL display.

A basic manufacturing method of the above organic EL display 1 will be described with reference to FIG. 8. FIG. 8 shows the step of forming the hole transport layer 24 etc. in the organic EL element 20 among the steps of the manufacturing method of the organic EL display 1.

First, the substrate 10 having formed thereon the TFTs 12, the first electrodes 21, etc. is prepared (also referred to as the "TFT substrate 10"). For example, a 500×400 mm rectangular glass plate having a thickness of about 1 mm can be used as a base of the TFT substrate 10. In this case, the interlayer film 14 can be formed with a thickness of about 2 μm, the first electrodes 21 can be formed with a thickness of about 100 nm, and the edge cover 15 can be formed with a thickness of about 1 μm. Since the TFT substrate 10 can be formed by a known method, description thereof is omitted.

The hole transport layer 24 is formed over the prepared TFT substrate 10 so as to cover the TFTs 12 etc. (step S1). Specifically, the material of the hole transport layer 24 is deposited over the entire display region 11. For example, a mask for the entire region, which has an opening of the same size as the display region 11, is bonded to the TFT substrate 10 so as to be in close contact therewith. The material of the hole transport layer 24 is deposited while rotating the TFT substrate 10 having thereon the mask for the entire region. For example, the hole transport layer 24 can be formed with a thickness of about 30 nm by using α-NPD. A conventional deposition apparatus can be used for this deposition process.

Next, the light-emitting layers 25R, 25G, 25B are stacked on the hole transport layer 24 (step S2). The light-emitting layers 25R, 25G, 25B of RGB are separately deposited color by color (separate deposition). The light-emitting layers 25R, 25G, 25B are typically deposited by co-deposition using a host material and a dopant material. Materials selected from known materials can be used as the materials of the light-emitting layers 25R, 25G, 25B, such as the host material and the dopant material. The light-emitting layers 25R, 25G, 25B can be formed with a thickness in the range of, e.g., 10-100 nm. In the present embodiment, the new deposition method and the deposition apparatus are used in this step, and will be described in detail later.

Then, the electron transport layer 26 is stacked on the light-emitting layers 25R, 25G, 25B (step S3). Specifically, the material of the electron transport layer 26 is deposited over the entire display region 11 by the same method as that used for the hole transport layer 24. Moreover, the electron injection layer 27 is stacked on the electron transport layer 26 (step S4). The electron injection layer 27 is also formed by the same method as that used for the hole transport layer 24, by depositing the material of the electron injection layer 27 over the entire display region 11.

Materials selected from known materials can be used as the materials of the electron transport layer 26 and the electron injection layer 27. Both the electron transport layer 26 and the electron injection layer 27 may be integrally formed by using the same material. Each of the electron transport layer 26 and the electron injection layer 27 may be formed with a thickness in the range of, e.g., 10-100 nm For example, the electron transport layer 26 may be formed with a thickness of 30 nm by using Alq, and the electron injection layer 27 may be formed with a thickness of 1 nm by using LiF.

Then, the second electrode 23 is stacked on the electron injection layer 27 (step S5). The second electrode 23 is also formed by the same method as that used for the hole transport layer 24, by depositing the material of the second electrode 23 over the entire display region 11. A material selected from known materials can be used as the material of the second electrode 23. For example, the second electrode 23 may be formed with a thickness of 50 nm by using aluminum (Al).

Lastly, the TFT substrate 10 having the organic EL element 20 thus formed thereon is bonded to the sealing plate 30 to hermetically seal the organic EL element 20. Thus, a main portion of the organic EL display 1 is completed.

(Separate Deposition)

The step of forming the light-emitting layers 25R, 25G, 25B by separate deposition (step S2) will be described below. Since the new deposition method and the deposition apparatus described above are used in this step, the basic configuration thereof will first be described.

(Deposition Apparatus)

Figure 9:
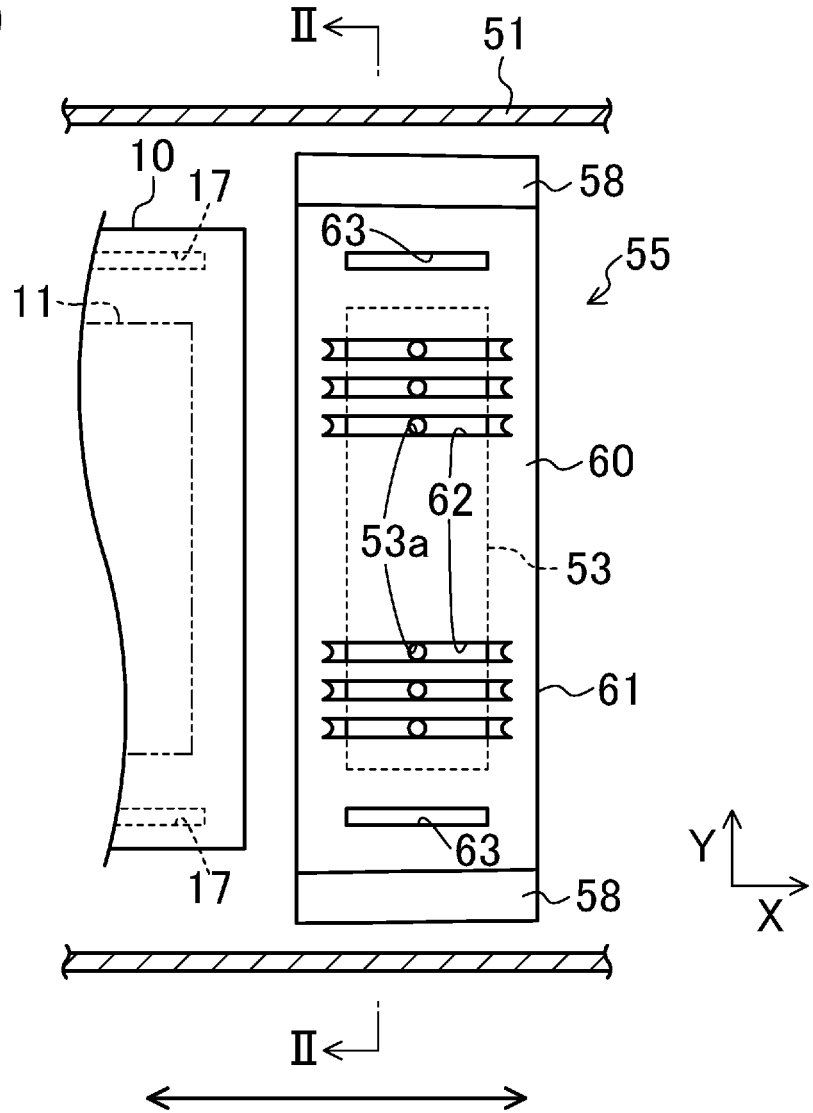
FIG. 9 is a schematic plan view showing a main part of a deposition apparatus.
Figure 10:
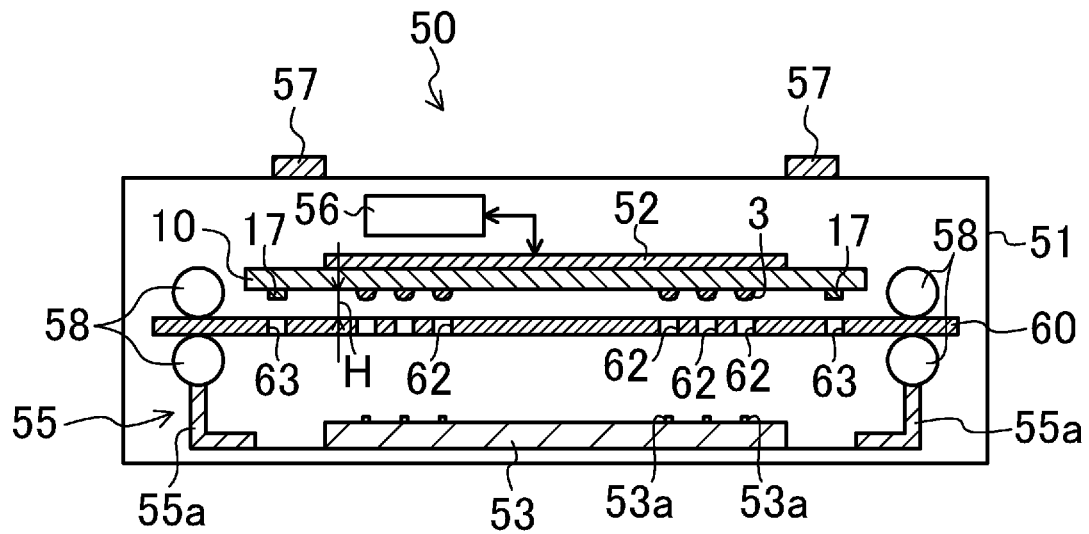
FIG. 10 is a schematic diagram showing a cross section taken along line II-II in FIG. 9.

FIGS. 9 and 10 show a deposition apparatus 50 of the present embodiment. As shown in these figures, the deposition apparatus 50 includes a vacuum chamber 51, a substrate support apparatus 52, a deposition source 53, a shadow mask 60 (a deposition mask), a mask unit 55, a moving apparatus 56, etc. The deposition apparatus 50 of the present embodiment is of a type in which deposition particles are emitted upward.

The vacuum chamber 51 is a box-shaped airtight container that can be opened and closed. The inside of the vacuum chamber 51 can be decompressed and held in a predetermined low pressure state by a decompression apparatus located outside the figure.

The substrate support apparatus 52 has a function to horizontally support the substrate 10 to be processed (also referred to as the "target substrate 10"), so that the row direction (the direction in which the sub-pixels 2R, 2G, 2B of each color are arranged in line) extends in the direction (the scanning direction) shown by an arrow in FIG. 9. For example, if the substrate support apparatus 52 is provided with an electrostatic chuck, the target substrate 10 can be held by the electrostatic chuck, and thus can be supported without being bent by its own weight.

The substrate support apparatus 52 is capable of moving horizontally, and the horizontal movement of the substrate support apparatus 52 in the scanning direction is automatically controlled by the moving apparatus 56. For convenience, the scanning direction is also referred to as the "X-axis direction," and the direction perpendicular to the scanning direction is also referred to as the "Y-axis direction." The X-axis and Y-axis directions are shown as appropriate in the figures.

The shadow mask 60 is horizontally placed below the target substrate 10 supported by the substrate support apparatus 52, with a constant gap H between the shadow mask 60 and the target substrate 10. The vertical distance (the shortest distance) of the gap H is preferably in the range of 50 μm to 1 mm If the vertical distance of the gap H is less than 50 μm, the target substrate 10 may contact the shadow mask 60. If the vertical distance of the gap H exceeds 1 mm, the deposition range may be excessively increased due to the deposition angle of the deposition particles, which may cause color mixture or reduction in patterning accuracy.

The shadow mask 60 has a rectangular plate-like mask body 61 comprised of a metal, and a plurality of openings 62, 62, . . . formed in a stripe pattern so as to be arranged in line in the direction along the longer side of the mask body 61 and to extend along the shorter side of the mask body 61 (only some of the openings are shown in the figures). For example, the plurality of openings 62, 62, . . . are formed so as to correspond to the rows of the sub-pixels 2R, 2G, 2B of each color of RGB. The dimension of the longer side of the mask body 61 is larger than the dimension in the Y-axis direction of the display region 11 of the target substrate 10 facing the mask body 61. The dimension of the shorter side of the mask body 61 is smaller than the dimension in the X-axis direction of the display region 11 of the target substrate 10 facing the mask body 61. The plurality of openings 62, 62, . . . are provided in the range corresponding to the display region 11 in the Y axial direction (an effective region).

A second marker 63 for alignment with a first marker 17 provided on the target substrate 10 is provided on both sides of the effective region. The first marker 17 and the second marker 63 are detected by a sensor 57 provided in the deposition apparatus 50, and the target substrate 10 and the shadow mask 60 are accurately positioned in the horizontal direction based on the detection value (these markers and the sensor are also referred to as the "positioning mechanism"). The shadow mask 60 is detachably mounted in the mask unit 55 so that the shorter side of the shadow mask 60 is parallel to the scanning direction. The shadow mask 60 will be described in detail later.

The mask unit 55 is provided with a holder 55a, a tension retaining apparatus 58, the deposition source 53, etc. The shadow mask 60 mounted in the mask unit 55 is horizontally supported by the tension retaining apparatus 58, and is held in a fixed relative positional relation with the deposition source 53 by the holder 55a.

The deposition source 53 is provided so as to extend along the Y-axis direction. The deposition source 53 is placed below the shadow mask 60 so as to face the target substrate 10 with the shadow mask 60 interposed therebetween. A plurality of emission ports 53a, 53a, . . . , from which the deposition particles are emitted toward the target substrate 10, are provided so as to be arranged in line in the Y-axis direction (only some of the emission ports are shown in the figures). In the present embodiment, these emission ports 53a, 53a, . . . are arranged at the positions corresponding to the openings 62 of the shadow mask 60, respectively, and each emission port 53a is located in the center (the center in both X-axis and Y-axis directions) of a corresponding one of the openings 62 as viewed in plan. The deposition apparatus 50 is provided with a shutter (not shown) that opens and closes the space between the deposition source 53 and the shadow masks 60. By controlling opening and closing of the shutter, the deposition apparatus 50 is automatically controlled so that deposition can be performed at appropriate timing.

The deposition apparatus 50 may have various configurations other than the above configuration of the deposition apparatus 50. For example, the deposition apparatus 50 may be configured so that the mask unit 55 is moved, rather than being configured so that the substrate 10 is moved. The number of emission ports 53a and the arrangement thereof can be adjusted as appropriate.

Figure 11:
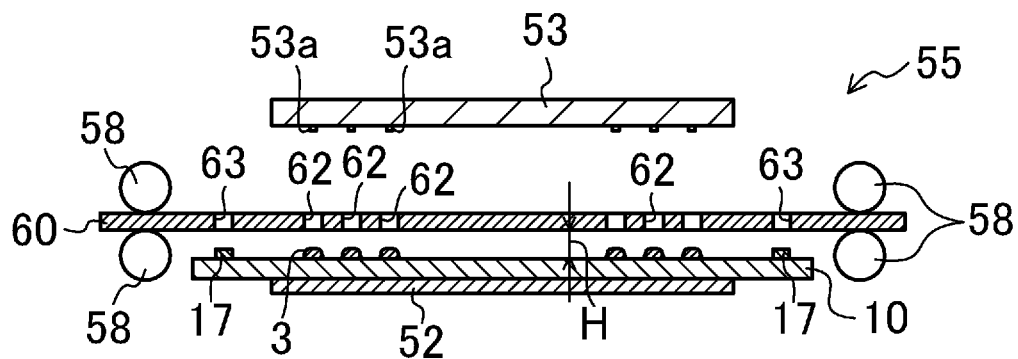
FIG. 11 is a schematic diagram showing a main part of a modification of the deposition apparatus.

As shown in FIG. 11, the positions of the mask unit 55 and the substrate support apparatus 52 may be reversed so that the deposition particles are emitted downward. Since the configuration and function of each member etc. are similar to those of the deposition apparatus 50 of the present embodiment, the same reference characters are used, and description thereof is omitted. The mask unit 55 can be easily moved in this case. This configuration is also advantageous in that the target substrate 10 can be easily supported.

(Deposition Method)

Figure 12:
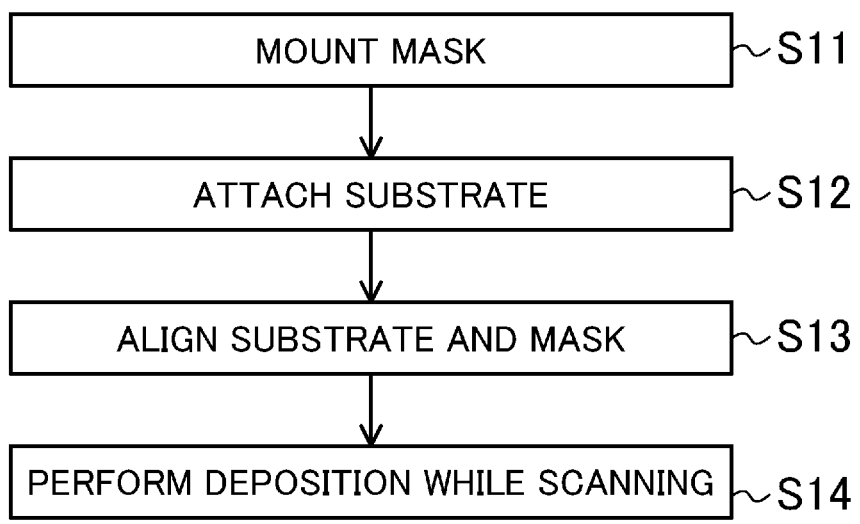
FIG. 12 is a flowchart showing a deposition process of a light-emitting layer.

FIG. 12 shows main steps of the deposition method. For example, the shadow mask 60 for the red (R) light-emitting layer 25R is mounted in the mask unit 55, and the shadow mask 60 is horizontally supported by the tension retaining apparatus 58 (step S11). At this time, the shadow mask 60 and the deposition source 53 are held in a fixed predetermined positional relation. A material for the red (R) light-emitting layer 25R has been placed in the deposition source 53. Next, the target substrate 10 is attached to and supported by the substrate support apparatus 52 so that the row direction of the target substrate 10 is parallel to the scanning direction (step S12). Then, the target substrate 10 and the shadow mask 60 are placed so as to face each other, and are aligned in the vertical direction so that the predetermined gap H is provided between the target substrate 10 and the shadow mask 60 (the alignment step, step S13).

After the target substrate 10 etc. is thus placed in the deposition apparatus 50, the deposition apparatus 50 is operated to perform deposition on the entire display region 11 of the target substrate 10 while scanning the target substrate 10 (the deposition step, step S14). In this deposition step, the target substrate 10 moves in the scanning direction at a constant scanning speed. The target substrate 10 has been accurately positioned in the horizontal direction with respect to the shadow mask 60 by the positioning mechanism. During the deposition step, the deposition particles are emitted from the deposition source 53, and are sequentially deposited on the target substrate 10 through the openings 62 of the shadow mask 60, whereby a thin film 3 is formed. The thickness of the thin film 3 can be controlled by, e.g., adjusting the scanning speed and the number of scanning times. After the deposition step, the thin film 3 (the red light-emitting layer 25R) having a stripe pattern is formed in the regions of the red (R) sub-pixels 2R, 2R, . . . of the target substrate 10.

After the red (R) light-emitting layer 25R is formed, the green (G) and blue (B) light-emitting layers 25G, 25B can be formed by the same deposition method by changing the shadow mask 60 and the materials of the deposition source 53. Since the sub-pixels 2R, 2G, 2B of each color of RGB are arranged at the same pitch, the same shadow mask 60 can be used for the sub-pixels 2R, 2G, 2B of the three colors by, e.g., shifting (moving) the shadow mask 60 in the Y-axis direction by a predetermined pitch.

(Deposition Mask)

As described above, in the new deposition method, the thin film 3 formed in a stripe pattern had a non-uniform thickness in some cases. That is, since the deposition amount was smaller at the ends (the ends in the Y-axis direction) of the opening 62 of the shadow mask 60, an individual film of the thin film 3 having a stripe pattern, specifically a film extending in a band shape (linearly) (also referred to as the "element film 3"), had a smaller thickness at its lateral ends.

Figure 13:
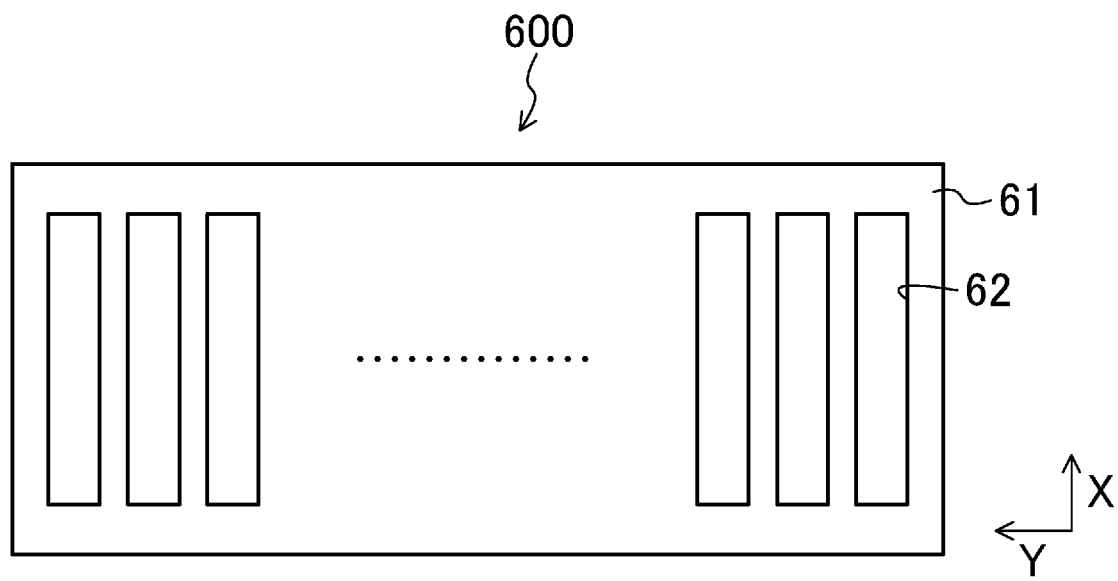
FIG. 13 is a schematic diagram showing a deposition mask before improvement.

In this case, a shadow mask 600 having rectangular strip-shaped openings 62 as shown in FIG. 13 was used as the shadow mask 60. However, a new shadow mask 60 (also referred to as the "improved mask 601") was produced in order to increase uniformity of the film thickness. The common members etc. of the masks are denoted by the same reference characters.

Figure 14:
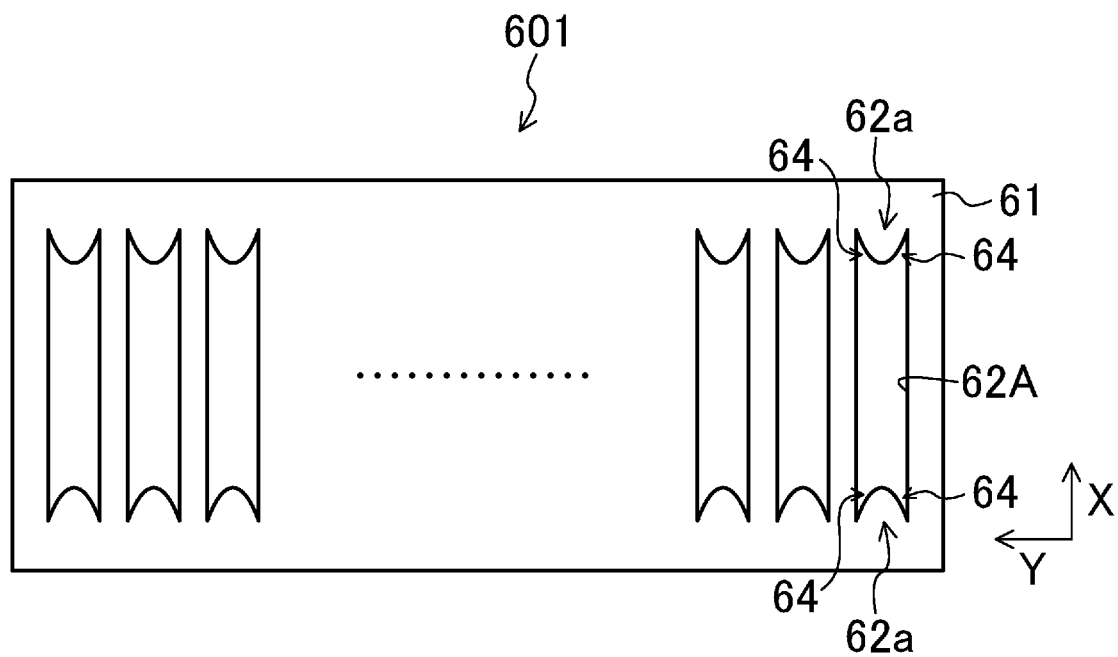
FIG. 14 is a schematic diagram showing an improved deposition mask of the first embodiment.

FIG. 14 shows the improved mask 601. The improved mask 601 has a rectangular plate-like mask body 61, and a plurality of strip-shaped (slit-like) openings (improved openings) 62A, 62A, . . . arranged in line along the longer side of the mask body 61 and formed so as to extend in the shorter side of the mask body 61. Each improved opening 62A is formed so that its opening amount (length) in the longitudinal direction (the direction perpendicular to the lateral direction; the X-axis direction when the improved mask 601 is mounted in the deposition apparatus 50) varies depending on the position in the lateral direction (the direction in which the openings 62A are arranged; the Y-axis direction when the improved mask 601 is mounted in the deposition apparatus 50). Specifically, each improved opening 62A is formed so as to have a larger opening amount at the ends in the lateral direction than in the central portion in the lateral direction.

Figure 15:
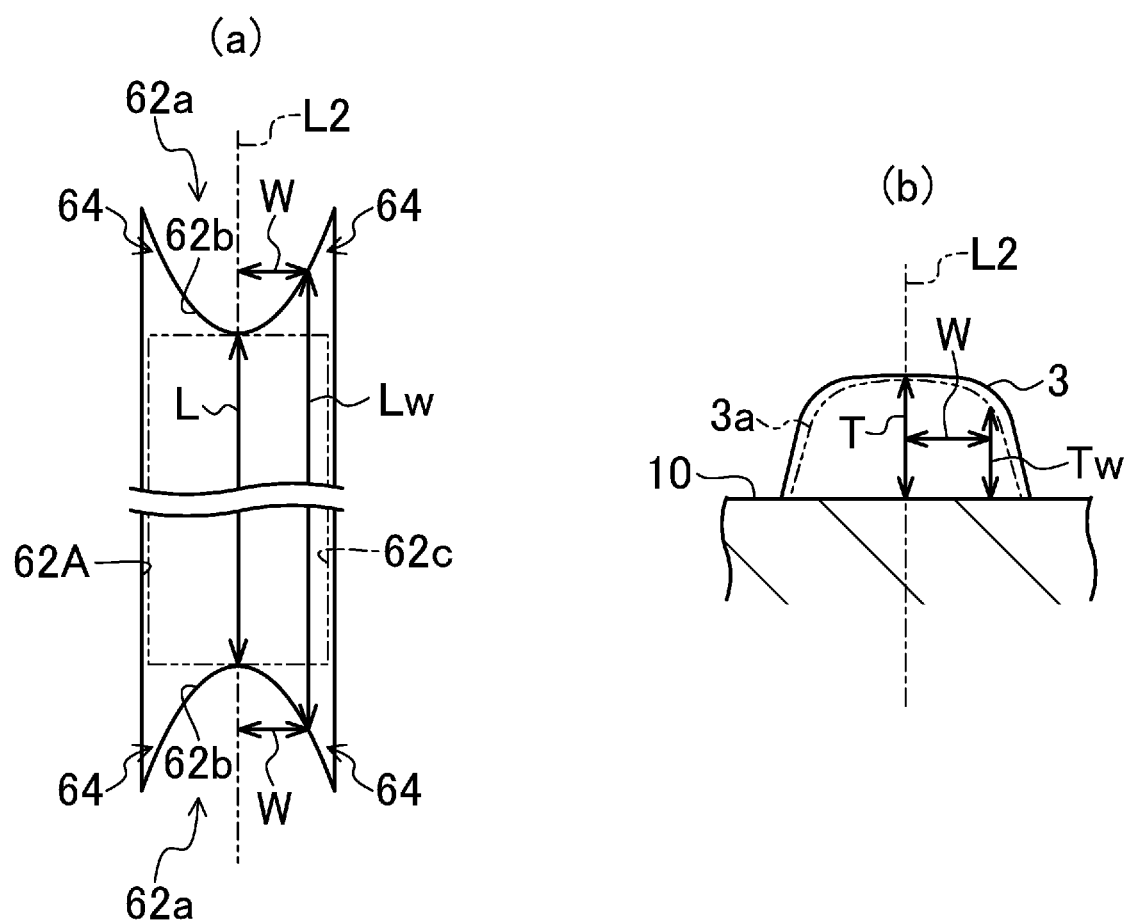
FIGS. 15A-15B are diagrams illustrating a method for setting the amount by which a protruding opening portion protrudes, where

More specifically, as shown also in FIG. 15A, the improved opening 62A is shaped so that both end portions 62a, 62a in the longitudinal direction protrude in an M shape. That is, in the both end portions 62a, 62a in the longitudinal direction, the improved opening 62A has protruding opening portions 64, 64 at each end in the lateral direction, and the protruding opening portions 64, 64 are formed so as to protrude with respect to the central portion in the lateral direction. The protruding opening portions 64, 64 are formed so that the opening amount gradually increases as the distance from the central portion in the lateral direction toward the end in the lateral direction increases. Each end face 62b of the protruding opening portions 64 is formed to have a parabolic shape.

According to the improved mask 601 shaped as described above, each improved opening 62A has a larger opening amount at both ends in the Y-axis direction than in the central portion in the Y-axis direction. Accordingly, when performing deposition while scanning, the deposition time is longer at both ends than in the central portion. If the deposition time is increased, the deposition amount is increased accordingly, whereby the reduction in thickness at the lateral ends of the element film 3 can be compensated for.

Referring to FIGS. 15A-15B, the amount by which the protruding opening portion 64 protrudes can be determined as follows. That is, as shown in FIG. 15A, "L2" represents a centerline that passes through the center in the lateral direction of the improved opening 62A and extends in the longitudinal direction, and "Lw" represents the opening amount including the protruding opening portion 64, at a predetermined distance W from the centerline L2 toward the end in the lateral direction. If the improved opening 62A has no protruding opening portion 64, and is formed only by a rectangular opening (an imaginary opening 62c) as shown by an imaginary line in FIG. 15A, "Tw" represents the thickness of the element film (an imaginary element film 3a) at the predetermined distance, as shown by an imaginary line in FIG. 15B. "L" represents the opening amount in the central portion in the lateral direction of the imaginary opening 62c (the improved opening 62A), and "T" represents the thickness in the central portion in the lateral direction of the imaginary element film 3a.

In this case, the protruding opening portion 64 is formed so as to satisfy a first relational expression (Lw/L≥T/Tw). The unit of "T," "L," "Tw," and "Lw" is millimeter (mm).

Since a constant scanning speed and a constant positional relation of the target substrate 10 etc. can be accurately maintained during deposition, determining the opening amount based on the first relational expression allows the film thickness at the lateral ends to be accurately adjusted. Providing the protruding opening portion 64 may increase the thickness in the central portion of the element film 3. In this case, the amount Lw can be finely adjusted in a range that is larger than the value obtained by the equation of the first relational expression.

(Modification of Deposition Mask)

As shown in FIGS. 16A-16E, the improved mask 601 may be formed in a different shape from the shape described above. For example, in an improved mask 601a shown in FIG. 16A, the protruding opening portions 64 are provided only in one end portion 62a in the longitudinal direction of the improved opening 62A (the other end portion 62a is rectangular). In an improved mask 601b of FIG. 16B, the end faces 62b of the protruding opening portions 64 are formed linearly. Namely, in one or both end portions 62a in the longitudinal direction of the improved opening 62A, the opening amount at both ends in the lateral direction need only be larger by a predetermined amount than that in the central portion in the lateral direction, and the one or both end portions 62a may have any shape.

Figure 16:
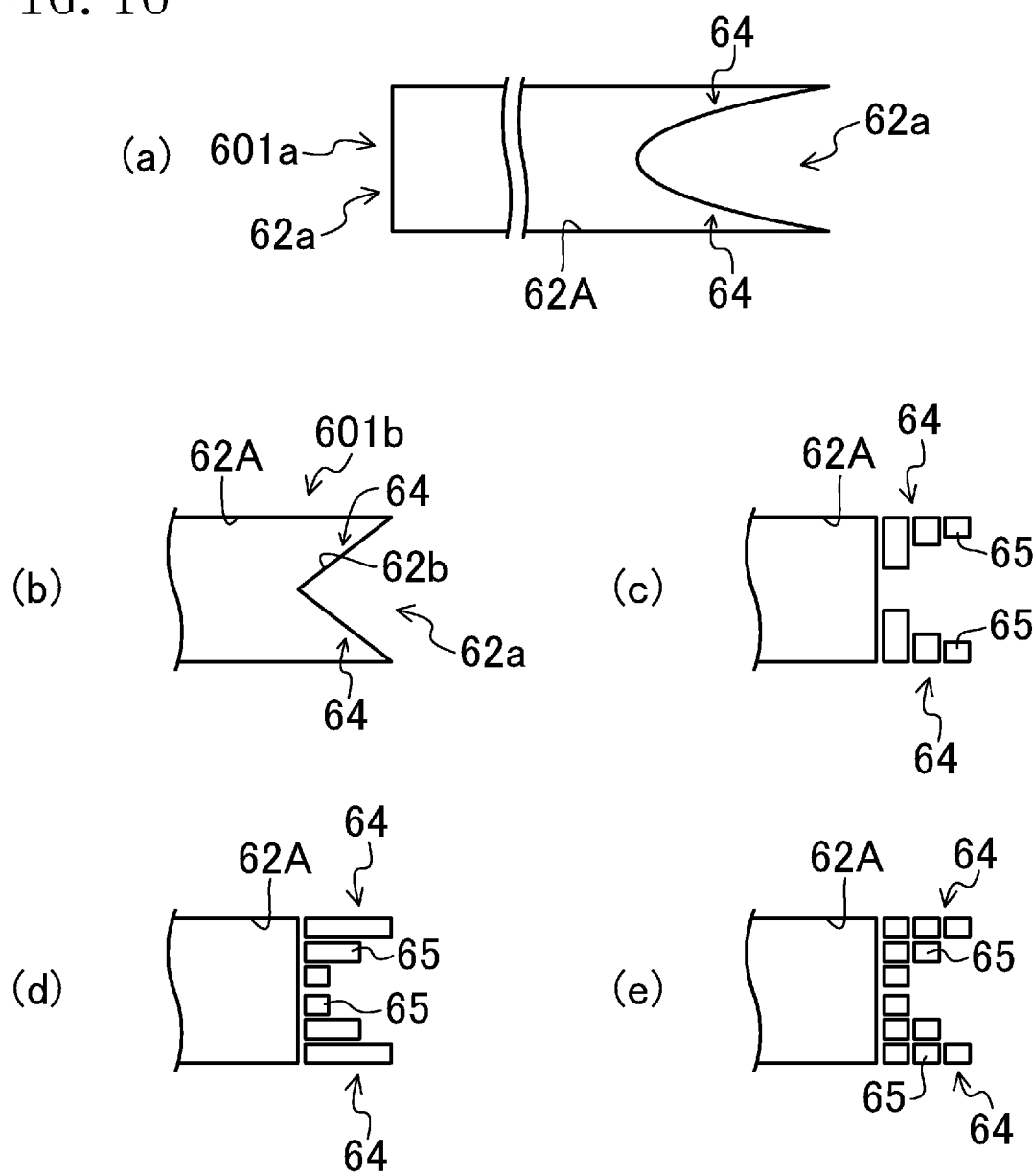
FIGS. 16A-16E are schematic diagrams showing modifications of the deposition mask.

For example, as shown in FIGS. 16C-16E, each protruding opening portion 64 of the improved mask 601 may be divided into a plurality of partial opening portions 65, 65, . . . Combining the rectangular partial opening portions 65 to form the protruding opening portion 64 increases the strength of the mask, and facilitates formation of the mask.

(Positional Relation between Deposition Mask and Pixel)

Figure 17:
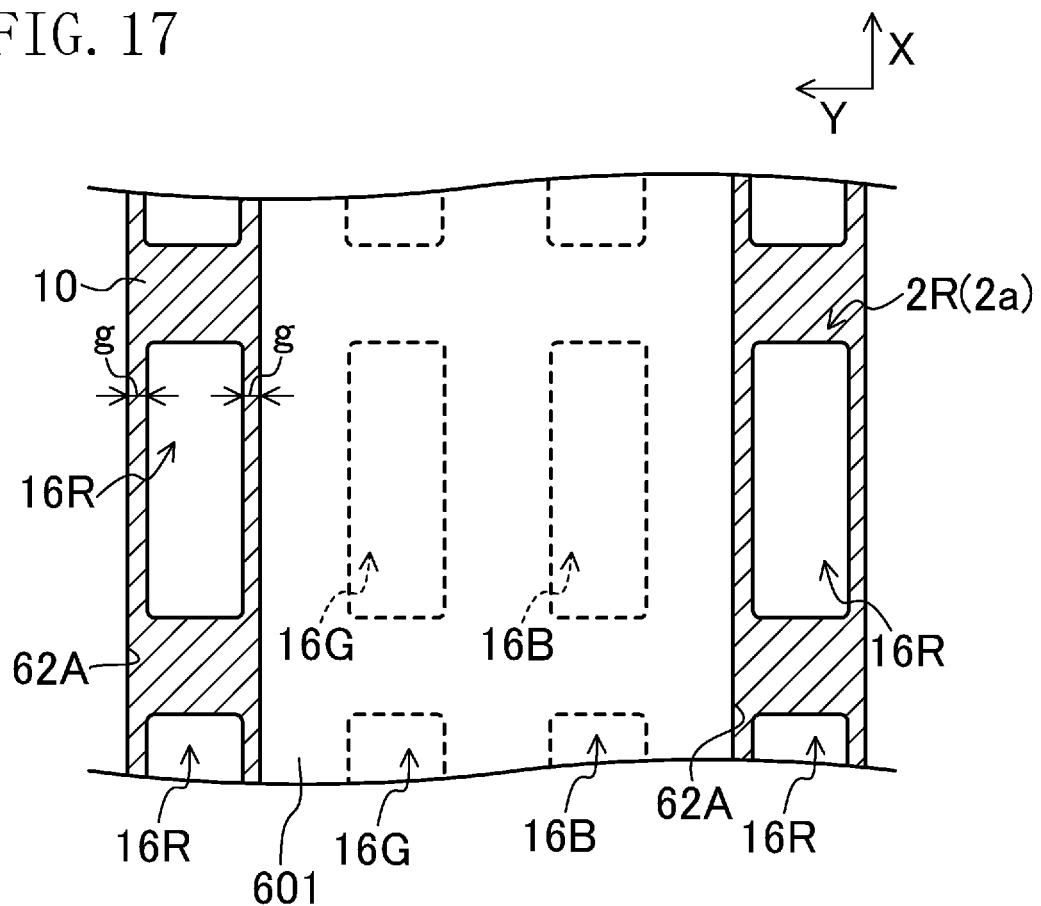
FIG. 17 is a schematic plan view showing the positional relation between the deposition mask and a pixel.

It is preferable that the improved opening 62A of the improved mask 601 have a predetermined positional relation with the sub-pixels 2R, 2G, 2B of the target substrate 10. FIG. 17 shows a state (a state in the deposition process) where, e.g., the target substrate 10 is accurately positioned in the horizontal direction with respect to the improved mask 601 by the positioning mechanism. In FIG. 17, the substrate 10 is viewed in the direction perpendicular to the substrate 10 from the side of the deposition source 53. For better understanding, the shaded region in the figure shows the portion except the light-emitting regions 16R, 16G, 16B in the substrate 10. In this case, the improved openings 62A are placed so as to face the sub-pixels 2R, 2G, 2B (pixels 2a to be formed, hereinafter referred to as the "film formation pixels 2a") in which the element films 3 are formed, respectively. For example, in the Y-axis direction, two rows of the green (G) and blue (B) sub-pixels 2G, 2B are present between two adjacent columns of the red (R) sub-pixels 2R, 2R. Accordingly, when forming the red (R) light-emitting layer 25R, the improved openings 62A are provided only in the portions facing the columns of the red (R) sub-pixels 2R.

As shown in FIG. 17, the improved mask 601 is positioned so that each of the light-emitting regions 16R, 16G, 16B of the film formation pixels 2a is located inside the improved opening 62A with a gap "g" therebetween.

Specifically, the predetermined amount of gap "g" (a design margin) is provided between the inner edge of the improved opening 62A, which extends in the X-axis direction, and the outer edge of the light-emitting region, which extends in the X-axis direction. Providing the design margin can reduce defective formation of the element films 3 due to a difference in dimensions between the improved mask 601 and the target substrate 10 and misalignment therebetween, whereby productivity in a mass production process can be improved.

FIRST EXAMPLE

The light-emitting layers 25R, 25G, 25B were formed by using the improved mask 601, the deposition apparatus 50, and the new deposition method described above. The improved mask 601 used in this example had a size of 200 mm (the X-axis direction)×600 mm (the Y-axis direction) with a thickness of 550 µm. The gap H between the target substrate 10 and the improved mask 601 was 200 µm. Each improved opening 62A had a width (the Y-axis direction) of 110 µm, and had a length (the X-axis direction) of 150 mm in its central portion and a length of 154.4 mm at the ends. The pitch of the improved openings 62A in the Y-axis direction was 450 µm. Each light-emitting region 16R, 16G, 16B of the film formation pixels 2a had a size of 300 µm (the X-axis direction)×90 µm (the Y-axis direction), and the pitch of the light-emitting regions 16R, 16G, 16B was 450 µm in the X-axis direction and 150 µm in the Y-axis direction.

A host material and a dopant material were used as the materials of the light-emitting layers 25R, 25G, 25B of each color, and the deposition speeds of these materials were 5.0 nm/s and 0.53 nm/s for red (R), 5.0 nm/s and 0.67 nm/s for green (G), and 5.0 nm/s and 0.67 nm/s for blue (B). Scanning with one reciprocating motion was performed once in the deposition process.

As a result, the RGB light-emitting layers 25R, 25G, 25B having a very uniform thickness were able to be formed.

The improved mask 601 may be used only to form the light-emitting layer 25R, 25G, 25B of at least one of the three colors. For example, in the case where non-uniformity of the thickness of the green (G) light-emitting layer 25G has substantially no influence on the quality, or the light-emitting region 16G can be formed only in the central portion where the thickness is relatively uniform, the shadow mask 60 before improvement can be used for the green (G) light-emitting layer 25G.

[Second Embodiment]

In the present embodiment, the shadow mask 60 and the mounting conditions thereof are changed so that, e.g., the uniformity of the thickness in the central portion of the element film 3 can be improved even if the width of the element film 3 is increased. Since the deposition apparatus 50, the deposition method, etc. are similar to those of the first embodiment, differences will be described in detail. Similar configurations and members will be denoted with the same reference characters, and description thereof will be omitted.

(Deposition Mask)

Figure 18:
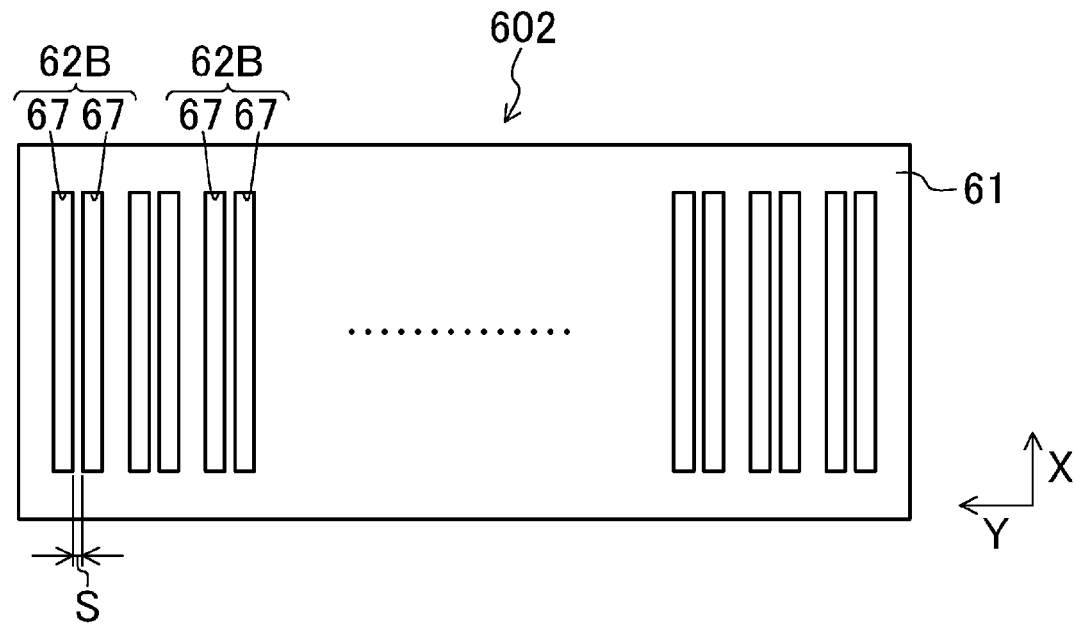
FIG. 18 is a schematic diagram showing a deposition mask in a second embodiment.

As shown in FIG. 18, the shadow mask 60 whose openings 62 have a different shape (a second improved mask 602) is used in the present embodiment. As shown in the figure, the openings 62 of the second improved mask 602 are formed by a plurality of element openings 67 separated in the lateral direction (second improved openings 62B).

Each second improved opening 62B of the present embodiment is formed by two rectangular band-shaped element openings 67, 67 formed by dividing the rectangular band-shaped opening 62 into two portions, and extending parallel to each other. The two element openings 67, 67 have the same width and extend through the second improved mask 602 substantially perpendicularly to the mask surface. The two element openings 67, 67 adjoin each other with a constant gap S therebetween in the lateral direction.

Although the number of element openings 67 is two in the present embodiment, the number of element openings 67 may be three or more. Increasing the number of element openings 67 can reduce undesirable deposition as described below, but has disadvantages such as making formation of the mask difficult. Accordingly, the number of element openings 67 is preferably 2 to 4.

Figure 19:
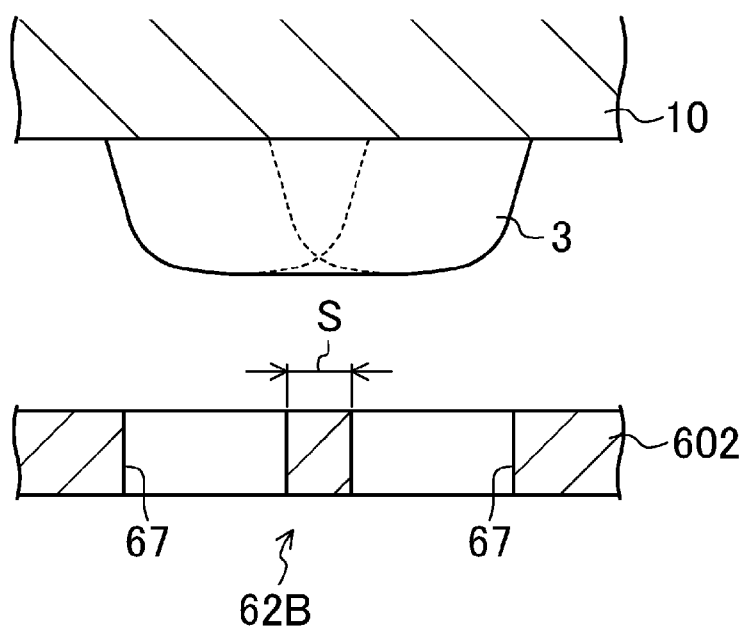
FIG. 19 is a schematic diagram schematically showing a cross-sectional shape of an element film in the second embodiment.

FIG. 19 schematically shows the cross-sectional shape of the element film 3 that is formed by using the second improved mask 602. As shown in the figure, deposition particles pass through the element openings 57 and adhere to the target substrate 10 to form two element films 3. At this time, adjoining ends of the two element films 3 overlap each other to form a single element film 3 (also referred to as the "coupled element film 3"). Predetermined conditions are used for the second improved mask 602 and the deposition apparatus 50 so that the coupled element film 3 including the overlapping portion has a uniform thickness.

Figure 20:
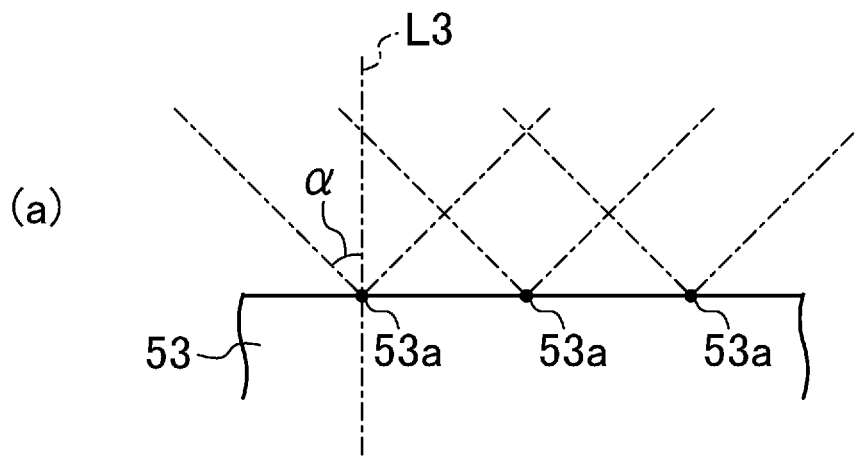
FIGS. 20A-20B are diagrams illustrating a second relational expression, where
Figure 20:
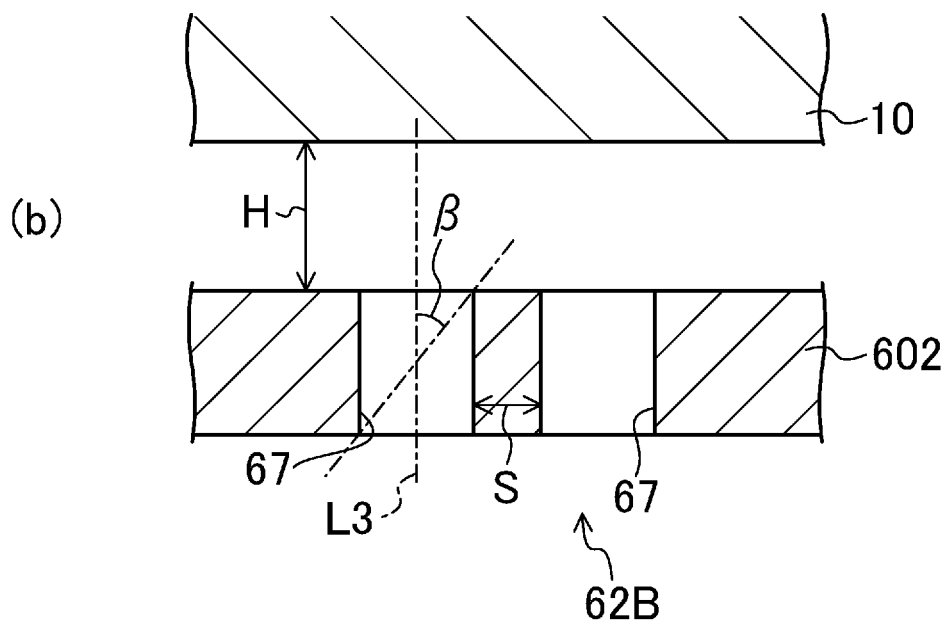

These conditions will be described with reference to FIGS. 20A-20B. FIG. 20A shows the deposition source 53 as viewed from the scanning direction, and FIG. 20B shows the second improved mask 602 and the target substrate 10 as viewed from the scanning direction. In the figures, the reference character "L3" represents a reference line indicating a direction substantially perpendicular to the target substrate 10.

As shown in FIG. 20A, each emission port 53a of the deposition source 53 is formed so that the emission direction thereof is aligned with the reference line L3, and the deposition particles are emitted in a radial fashion from each emission port 53a toward the target substrate 10. In this example, "α" represents the largest angle (spread angle) at which the deposition particles spread with respect to the emission direction.

As shown in FIG. 20B, the angle at which the deposition particles pass through each element opening 67 is limited by the opening width of the element opening 67 etc. "β" represents the largest angle at which the deposition particles can pass through the element opening 67. The gap H between the target substrate 10 and the second improved mask 602 as described above and the interval S between the two element openings 67, 67 are determined so as to satisfy a second relational expression (S<H×tan θ, θ=α when α≤β, and θ=β when α>β). The unit of "S" and "H" is micrometer (µm), and the unit of "α" and "β" is degree (°).

In general, the spread angle α of the deposition particles is often larger than the angle β of the deposition particles, and thus the angle at which the deposition particles are deposited on the target substrate 10 is limited by the angle β. That is, θ is often equal to β. Accordingly, in this case, adjustment is difficult if the conditions are determined based on the spread angle α of the deposition particles, and it is difficult to obtain a uniform film thickness. In the present embodiment, since the conditions are determined in consideration of the angle β, accurate adjustment can be made relatively easily.

Since excessively reducing the value of the interval S increases the thickness in the central portion, fine adjustment can be made according to the situation. The angle β of the deposition particles also varies depending on the thickness of the second improved mask 602, the interval S, and the cross-sectional shape of the element opening 67, etc. The element openings 67 of the present embodiment are formed to extend substantially perpendicularly to the mask surface. However, for example, the element openings 67 may be formed to extend obliquely.

Moreover, the second improved mask 602 is advantageous in that the width of undesirable deposition (the width of the element film 3 that is formed outside the opening 62 of the shadow mask 60) can be reduced.

Figure 21:
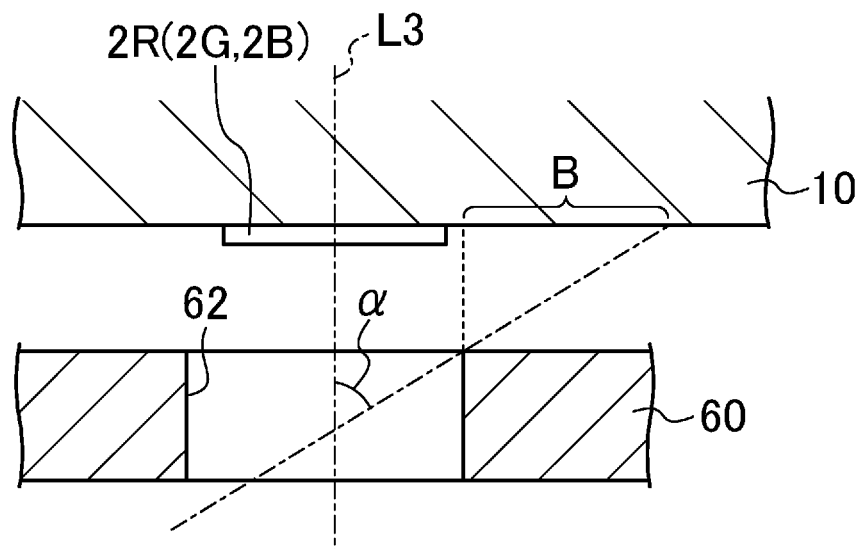
FIG. 21 is a diagram illustrating the width of undesirable deposition.
Figure 22:
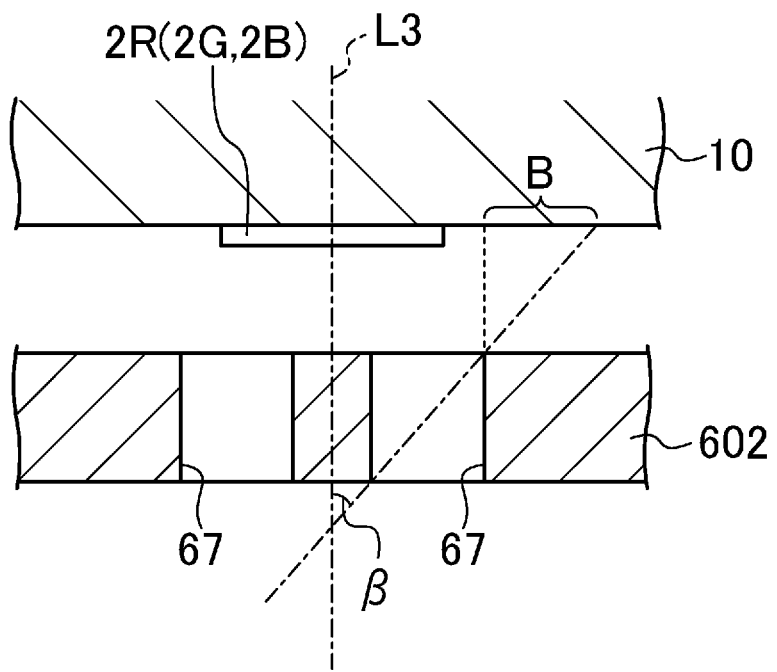
FIG. 22 is a diagram illustrating the width of undesirable deposition.

As shown in FIG. 21, in the case where, e.g., a wide element film 3 is formed by using the shadow mask 60 before improvement in which each opening 62 is formed by a single opening, "θ" in the second relational expression is equal to "α," and the width of undesirable deposition (shown by reference character "B" in the figure) is equal to "H×tan α" due to the large opening width. On the other hand, as shown in FIG. 22, in the case where the same element film 3 is formed by using the plurality of element openings 67, "θ" in the second relational expression is equal to "β," and the width B of undesirable deposition is equal to "H×tan β" due to the narrow opening width. Since α>β, the second improved mask 602 in which each opening 62 is formed by the plurality of element openings 67 provides a narrower width B of undesirable deposition than the shadow mask 60 before improvement.

If the amount of undesirable deposition is large, the deposited film may enter an adjoining one of the sub-pixels 2R, 2G, 2B, causing color mixture or a defective pixel. Accordingly, the pitch of the sub-pixels 2R, 2G, 2B need be determined in view of the undesirable deposition. In the present embodiment, since the width B of undesirable deposition can be reduced, the opening 62 assigned to each sub-pixel 2R, 2G, 2B can be made to have a relatively large width. This can reduce the influence of the ends in the lateral direction of the coupled element film 3, whereby uniformity of the film thickness in the light-emitting regions 16R, 16G, 16B can be improved.

Moreover, increasing the width of the opening 62 tends to cause deformation of the shadow mask 60 such as distortion, due to stress or thermal expansion. Such deformation of the shadow mask 60 significantly affects deposition accuracy. Since each opening 62 is formed by the plurality of element openings 67, the second improved mask 602 is also advantageous in that structural rigidity can be increased and deformation can be suppressed.

Furthermore, since the target substrate 10 is not integral with the second improved mask 602, and the target substrate 10 and the second improved mask 602 can be positioned so as to have the gap H therebetween, fine adjustment of the second relational expression can be easily made, resulting in high productivity in a mass production process.

Figure 23:
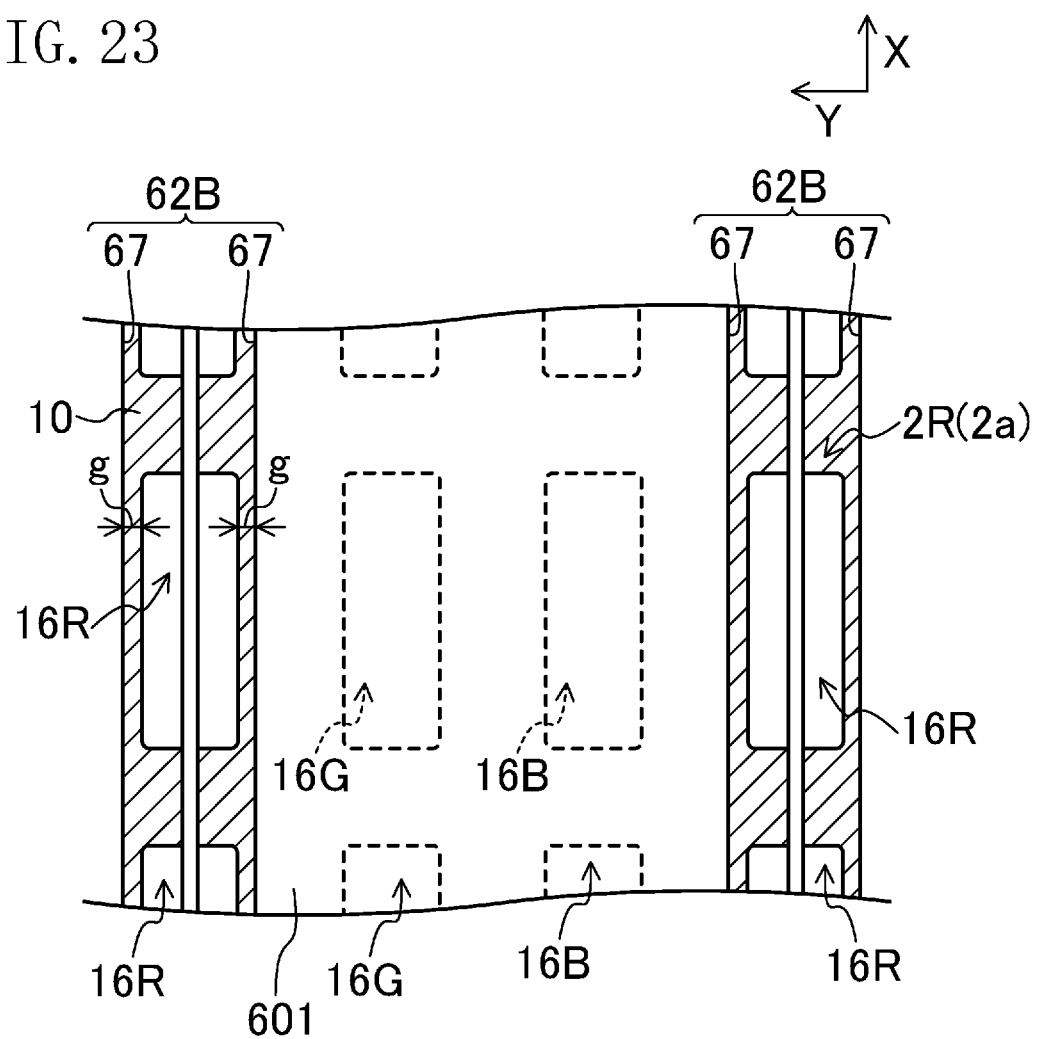
FIG. 23 is a schematic plan view showing the positional relation between the deposition mask and a pixel in the second embodiment.

FIG. 23 shows a diagram corresponding to FIG. 17 in the present embodiment. As shown in FIG. 23, in the present embodiment as well, the second improved mask 602 is positioned so that each of the light-emitting regions 16R, 16G, 16B of the film formation pixels 2a is located inside the second improved opening 62B with a gap "g" therebetween. Specifically, the predetermined amount of gap "g" (a design margin) is provided between the outer edge of the element opening 67 located at the outermost position in the Y-axis direction in the second improved opening 62B and the outer edge of the light-emitting region 16R, 16G, 16B.

In the present embodiment, defective formation of the coupled element film 3 can be reduced. Moreover, reduction in film thickness at the ends in the lateral direction can be prevented from affecting the light-emitting regions 16R, 16G, 16B.

SECOND EXAMPLE

The light-emitting layers 25R, 25G, 25B were formed by using the second improved mask 602, the deposition apparatus 50, and the new deposition method described above. As in the first example, the second improved mask 602 used in this example had a size of 200 mm (the X-axis direction)×600 mm (the Y-axis direction) with a thickness of 550 µm. The gap H between the target substrate 10 and the second improved mask 602 was 200 µm. Each of the second improved openings 62A was formed by two element openings 67, 67. The element openings 67, 67 had an opening width of 55 µm, and the interval S between the element openings 67, 67 was 19 µm.

Each of the second improved openings 62B had a length (the X-axis direction) of 150 mm The pitch of the second improved openings 62B in the Y-axis direction was 450 µm. Each light-emitting region 16R, 16G, 16B of the film formation pixels 2a had a size of 300 µm (the X-axis direction)×90 µm (the Y-axis direction), and the pitch of the light-emitting regions 16R, 16G, 16B was 450 µm in the X-axis direction and 150 µm in the Y-axis direction. The materials of the light-emitting layers 25R, 25G, 25B, the deposition speed, the deposition method, etc. are the same as those of the first embodiment.

Regarding the second relational expression, the spread angle α of the deposition particles was 20° or more, while the angle β of the deposition particles was 5.7° (θ=5.7°).

As a result, the RGB light-emitting layers 25R, 25G, 25B having a very uniform thickness with a narrow width B of undesirable deposition were able to be formed.

For example, in the shadow mask 60 having a thickness of 550 µm, if the opening 62 corresponding to each row of the sub-pixels 2R, 2G, 2B is formed by a single opening, and the opening 62 has an opening width of 110 µm, the opening 62 has a cross-sectional aspect ratio (a transverse cross-sectional aspect ratio) of 5 (=550/110) in the Y-axis direction. In this example, however, since each element opening 67 has an opening width of 55 µm, the transverse cross-sectional aspect ratio of the element opening 67 is 10 (=550/55). Thus, the transverse cross-sectional aspect ratio is increased.

As the transverse cross-sectional aspect ratio is increased, the angle β of the deposition particles is reduced, and thus the width B of undesirable deposition can be reduced. For example, the width B of undesirable deposition was 40 µm in the case of the single opening 62, but was able to be reduced to 20 µm in this example.

Although the opening width is 110 µm in the case of the single opening 62, a substantial opening width is 129 µm (=55×2+19) in this example, which is larger than that in the case of the single opening 62. As a result, the ends in the lateral direction of the second improved opening 62B are located farther away from the light-emitting regions 16R, 16G, 16B. Accordingly, even if the film thickness is reduced at the ends in the lateral direction, the influence of such reduction in film thickness on the light-emitting regions 16R, 16G, 16B can be reduced.

The interval S between the element openings 67, which is 19 μm, satisfies the second relational expression. That is, as described above, since θ is 5.7°, and the gap H between the target substrate 10 and the second improved mask 602 is 200 μm, "H×tan θ" is 20 μm, and the interval S satisfies the second relational expression.

In this case, according to the expression of Patent Document 2, the interval between the element openings 67 is 70 μm or more, and the overlapping portion may have a non-uniform thickness.

As described above, according to the deposition mask etc. of the present invention, uniformity of the film thickness, which is an important quality in deposition, can be improved by merely changing the shape of the openings of the deposition mask and the setting conditions of the deposition apparatus. Accordingly, image display performance, long-term product reliability, etc. of organic EL displays can further be improved without requiring high facility cost such as adding special processes and devices.

Description of Reference Characters

1 Organic EL Display
2R, 2G, 2B Sub-pixel
3 Thin Film, Element Film
10 Substrate
11 Display Region
16R, 16G, 16B Light-Emitting Region
20 Organic EL Element
21 First Electrode
22 Organic EL Layer
23 Second Electrode
24 Hole Transport Layer
25R, 25G, 25B Light-Emitting Layer
26 Electron Transport Layer
27 Electronic Injection Layer
30 Sealing Plate
40 Sealing Member
50 Deposition Apparatus
51 Vacuum Chamber
52 Substrate Support Apparatus
53 Deposition Source
53a Emission Port
55 Mask Unit
56 Moving Apparatus
60 Shadow Mask
61 Mask Body
62 Opening
62A Improved Opening
62B Second Improved Opening
62a End Portion
64 Protruding Opening Portion
65 Partial Opening Portion
67 Element Opening
601 Improved Mask
602 Second Improved Mask
L2 Centerline
H Gap
S Interval
g Gap

The invention claimed is:

1. A deposition apparatus, comprising:
a deposition mask that is used to form a thin film in a stripe pattern on a substrate by deposition, including a plate-like mask body, a and a plurality of openings arranged in line in the mask body, the plurality of openings including an improved opening in which an opening amount in a longitudinal direction perpendicular to a lateral direction varies depending on a position in the lateral direction, and the lateral direction is a direction parallel to a direction in which the plurality of openings are arranged, and the improved opening being formed so that the opening amount at an end in the lateral direction is larger than that in a central portion in the lateral direction;
a deposition source that emits deposition particles forming the thin film;
a mask unit that includes the deposition mask and the deposition source, and maintains a fixed relative positional relation between the deposition mask and the deposition source;
a substrate support apparatus that supports the substrate; and
a moving apparatus that relatively moves at least one of the mask unit and the substrate along a predetermined scanning direction with a constant gap being provided between the substrate and the deposition mask, wherein
the deposition mask is placed so that the longitudinal direction is parallel to the scanning direction, and
a distance of the constant gap is in a range of 50 μm to 1 mm.

2. The deposition apparatus of claim 1, wherein
the improved opening has a protruding opening portion in at least one end portion in the longitudinal direction, and the protruding opening portion opens in the end in the lateral direction so as to protrude with respect to the central portion in the lateral direction.

3. The deposition apparatus of claim 2, wherein
the protruding opening portion is formed so that its opening amount gradually increases as a distance from the central portion in the lateral direction toward the end in the lateral direction increases.

4. The deposition apparatus of claim 3, wherein
the protruding opening portion is divided into a plurality of partial opening portions.

5. A deposition method for forming the thin film in a stripe pattern on the substrate by using the deposition apparatus of claim 1, comprising:
an aligning step of, with the substrate being supported by the substrate support apparatus and with the gap being provided between the substrate and the deposition mask, aligning the mask unit and the substrate so that the mask unit faces the substrate; and
a deposition step of forming the thin film by sequentially depositing the deposition particles while relatively moving at least one of the mask unit and the substrate along the predetermined scanning direction by the moving apparatus.

6. The deposition method of claim 5, wherein
a substrate for an organic EL display in which a plurality of pixels each having a light-emitting region configured to emit light are arranged in a grid pattern is used as the substrate,
the plurality of openings are placed so as to face a plurality of film formation pixels that are included in the plurality of pixels, and
the deposition mask is positioned so that each of the light-emitting regions of the film formation pixels is located inside the improved opening in the lateral direction with a gap therebetween, as viewed from a direction perpendicular to the substrate.

7. The deposition method of claim 5, wherein
a first relational expression (Lw/L≥T/Tw) is satisfied,
where a centerline passes through a center in the lateral direction of the improved opening and extends in the longitudinal direction, "Lw" represents the opening amount of the improved opening including the protruding opening portion, at a predetermined distance W from the centerline toward the end in the lateral direction, and
if the improved opening has no protruding opening portion, "Tw" represents a thickness of the thin film at the predetermined distance, "L" represents the opening amount in the central portion in the lateral direction, and "T" represents a thickness in the central portion in the lateral direction of the thin film (a unit of "T," "L," "Tw," and "Lw" is millimeter).

8. A deposition apparatus that is used to form a thin film in a stripe pattern on a substrate by deposition, comprising:
a deposition mask having a plurality of openings arranged in line;
a deposition source that emits deposition particles forming the thin film toward the substrate;
a mask unit that includes the deposition mask and the deposition source, and maintains a fixed relative positional relation between the deposition mask and the deposition source;
a substrate support apparatus that supports the substrate; and
a moving apparatus that relatively moves at least one of the mask unit and the substrate along a predetermined scanning direction with a constant gap H being provided between the substrate and the deposition mask, wherein
the deposition mask is placed so that a lateral direction in which the plurality of openings are arranged is perpendicular to the scanning direction,
the plurality of openings include a second improved opening that is formed by a plurality of element openings separated from each other in the lateral direction,
the plurality of element openings in the second improved opening adjoin each other with a constant gap S therebetween in the lateral direction,
a distance of the constant gap H is in a range of 50 μm to 1 mm,
a second relational expression (S<H×tan θ, θ=α when α≤β, and θ=β when α>β) is satisfied,
where "α" represents a spread angle at which the deposition particles spread with respect to an emission direction substantially perpendicular to the substrate, and "β" represents a largest angle at which the deposition particles can pass through the element opening (a unit of "S" and "H" is micrometer, and a unit of "α" and "β" is degree), as viewed from the scanning direction, and
adjoining ends of films formed by the deposition particles passing through the plurality of element openings and adhering to the substrate integrally overlap each other to form the thin film.

9. A deposition method for forming the thin film in a stripe pattern on the substrate by using the deposition apparatus of claim 8, comprising:
an aligning step of, with the substrate being supported by the substrate support apparatus and with the gap being provided between the substrate and the deposition mask, aligning the mask unit and the substrate so that the mask unit faces the substrate; and
a deposition step of forming the thin film by sequentially depositing the deposition particles while relatively moving at least one of the mask unit and the substrate along the scanning direction by the moving apparatus.

10. The deposition method of claim 9, wherein
a substrate for an organic EL display in which a plurality of pixels each having a light-emitting region configured to emit light are arranged in a grid pattern is used as the substrate,
the plurality of openings are placed so as to face a plurality of film formation pixels that are included in the plurality of pixels, and
the deposition mask is positioned so that each of the light-emitting regions of the film formation pixels is located inside the second improved opening in the lateral direction with a gap therebetween, as viewed from a direction perpendicular to the substrate.

* * * * *